(12) United States Patent
Tani

(10) Patent No.: US 12,294,405 B2
(45) Date of Patent: *May 6, 2025

(54) RADIO-FREQUENCY CIRCUIT, RADIO-FREQUENCY FRONT-END CIRCUIT, AND COMMUNICATION APPARATUS

(71) Applicant: Murata Manufacturing Co., Ltd., Kyoto (JP)

(72) Inventor: Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 364 days.

This patent is subject to a terminal disclaimer.

(21) Appl. No.: 17/661,771

(22) Filed: May 3, 2022

(65) Prior Publication Data
US 2022/0263535 A1 Aug. 18, 2022

Related U.S. Application Data

(63) Continuation of application No. PCT/JP2020/029779, filed on Aug. 4, 2020.

(30) Foreign Application Priority Data

Nov. 20, 2019 (JP) .................................. 2019-210025

(51) Int. Cl.
 *H04B 1/40* (2015.01)
(52) U.S. Cl.
 CPC ...................................... *H04B 1/40* (2013.01)
(58) Field of Classification Search
 CPC ........ H04B 1/0057; H04B 1/006; H04B 1/40; H04B 1/48; H04B 1/18; H04B 1/406;
(Continued)

(56) References Cited

U.S. PATENT DOCUMENTS

2018/0041174 A1* 2/2018 Muto ..................... H03F 3/195
2019/0089323 A1 3/2019 Nosaka
(Continued)

FOREIGN PATENT DOCUMENTS

JP 2018-026795 A 2/2018
JP 2019-068205 A 4/2019
(Continued)

OTHER PUBLICATIONS

International Search Report for PCT/JP2020/029779 dated Oct. 6, 2020.

*Primary Examiner* — Ajibola A Akinyemi
(74) *Attorney, Agent, or Firm* — McDonald Hopkins LLC

(57) ABSTRACT

In a radio-frequency circuit, a first switch is connected to an antenna terminal. A second switch is connected to the first switch and is connected to the antenna terminal via the first switch. A first filter is connected to the first switch without having the second switch interposed therebetween and allows a radio-frequency signal of a first communication band to pass through the first filter. A second filter is connected to the first switch via the second switch and allows a radio-frequency signal of a second communication band to pass through the second filter. The second communication band is higher than the first communication band. The radio-frequency circuit further includes an inductor. The inductor is not connected in series with the first filter and is connected in series with the first switch and the second switch between the first switch and the second switch.

10 Claims, 13 Drawing Sheets

(58) Field of Classification Search
CPC ........ H04B 1/00; H04B 17/18; H04B 7/0617;
H04B 1/0064; H04B 1/0458; H04B
1/1036; H04B 1/123; H04B 1/403; H04B
1/44; H04B 1/525; H04B 2001/485
USPC .......................................................... 455/73
See application file for complete search history.

(56) References Cited

U.S. PATENT DOCUMENTS

| | | |
|---|---|---|
| 2019/0103843 A1 | 4/2019 | Aikawa |
| 2020/0083865 A1 | 3/2020 | Mori |
| 2020/0136659 A1 | 4/2020 | Yamada |
| 2020/0220568 A1 | 7/2020 | Watanabe |
| 2020/0228074 A1 | 7/2020 | Naniwa et al. |

FOREIGN PATENT DOCUMENTS

| | | |
|---|---|---|
| WO | 2017/199690 A1 | 11/2017 |
| WO | 2018/212048 A1 | 11/2018 |
| WO | 2019/004152 A1 | 1/2019 |
| WO | 2019/054176 A1 | 3/2019 |
| WO | 2019/065569 A1 | 4/2019 |

\* cited by examiner

Band3

Band1

Band40

Band7

Band3

Band1

Band40

Band7

Band3

Band1

Band40

Band7

Band3

Band1

Band40

Band7

RADIO-FREQUENCY CIRCUIT, RADIO-FREQUENCY FRONT-END CIRCUIT, AND COMMUNICATION APPARATUS

CROSS REFERENCE TO RELATED APPLICATION

This is a continuation of International Application No. PCT/JP2020/029779 filed on Aug. 4, 2020 which claims priority from Japanese Patent Application No. 2019-210025 filed on Nov. 20, 2019. The contents of these applications are incorporated herein by reference in their entireties.

BACKGROUND ART

Technical Field

The present disclosure generally relates to a radio-frequency circuit, a radio-frequency front-end circuit, and a communication apparatus, and more particularly, to a radio-frequency circuit including plural filters connected to an antenna terminal, a radio-frequency front-end circuit including the radio-frequency circuit, and a communication apparatus including the radio-frequency front-end circuit.

Hitherto, a radio-frequency circuit disposed in a front-end section of a multimode-/multiband-support cellular phone and a communication apparatus including such a radio-frequency circuit are known (Patent Document 1). The radio-frequency circuit disclosed in Patent Document 1 has multiple radio-frequency paths through which plural radio-frequency signals whose frequency bands are different from each other are transmitted.

The radio-frequency circuit disclosed in Patent Document 1 includes a first switch unit, a first matching circuit, and a filter unit. An input terminal (antenna terminal) of the first switch unit is connected to an antenna device. An output terminal of the first switch unit and an input terminal of the filter unit are connected to each other via the first matching circuit. The first switch unit includes three switches that separate radio-frequency signals received by the antenna device into radio-frequency paths corresponding to respective filters forming the filter unit. The first matching circuit includes plural inductors. One end of each of the plural inductors is connected to a corresponding one of the plural paths that connect the first switch unit and the plural filters. The other end of each of the plural inductors is connected to a ground.

Patent Document 1: International Publication No. 2019/065569

BRIEF SUMMARY

In the radio-frequency circuit disclosed in Patent Document 1, when simultaneous communication, such as carrier aggregation, is performed, for example, variations among impedances of the plural filters in the communication bands thereof when the filters are seen from the antenna terminal may be increased.

The present disclosure provides a radio-frequency circuit, a radio-frequency front-end circuit, and a communication apparatus that can reduce variations among impedances of plural filters in communication bands thereof when the filters are seen from an antenna terminal.

A radio-frequency circuit according to an aspect of the present disclosure includes an antenna terminal, a first switch, a second switch, a first filter, and a second filter. The first switch is connected to the antenna terminal. The second switch is connected to the first switch and is connected to the antenna terminal via the first switch. The first filter is an acoustic wave filter that is connected to the first switch without necessarily having the second switch interposed therebetween and that allows a radio-frequency signal of a first communication band to pass through the first filter. The second filter is an acoustic wave filter that is connected to the first switch via the second switch and that allows a radio-frequency signal of a second communication band to pass through the second filter. The second communication band is higher than the first communication band. The radio-frequency circuit further includes an inductor. The inductor is not connected in series with the first filter and is connected in series with the first switch and the second switch between the first switch and the second switch.

A radio-frequency front-end circuit according to an aspect of the present disclosure includes the radio-frequency circuit, a first low-noise amplifier, and a second low-noise amplifier. The first low-noise amplifier is connected to the first filter of the radio-frequency circuit. The second low-noise amplifier is connected to the second filter of the radio-frequency circuit.

A communication apparatus according to an aspect of the present disclosure includes the radio-frequency front-end circuit and a signal processing circuit. The signal processing circuit performs signal processing on the radio-frequency signal of the first communication band and the radio-frequency signal of the second communication band.

The radio-frequency circuit, the radio-frequency front-end circuit, and the communication apparatus according to the above-described aspects of the present disclosure can reduce variations among impedances of the plural filters in the communication bands thereof when the filters are seen from the antenna terminal.

DETAILED DESCRIPTION

First Embodiment

Figure 1:
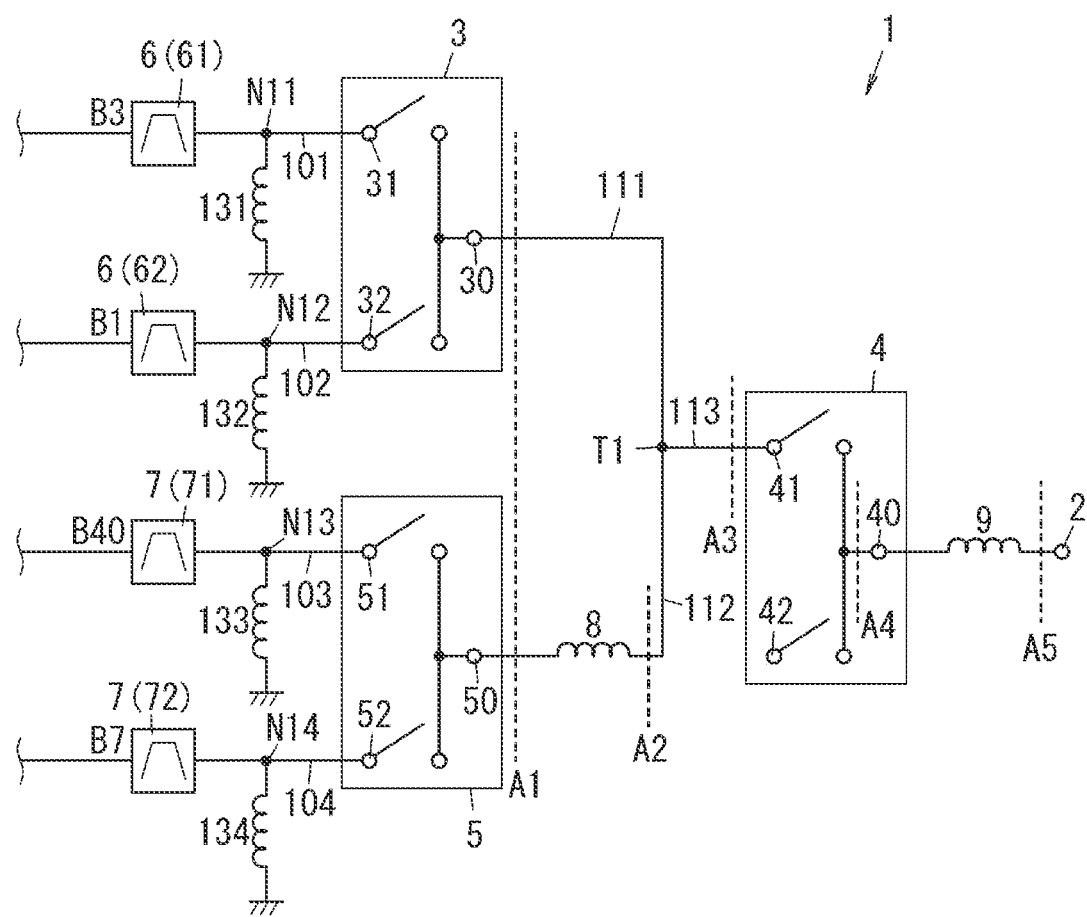
FIG. 1 is a circuit diagram of a radio-frequency circuit according to a first embodiment.

Hereinafter, a radio-frequency circuit 1, a radio-frequency front-end circuit 200, and a communication apparatus 300 according to a first embodiment will be described below with reference to FIGS. 1 and 2.
(1) Radio-Frequency Circuit
(1.1) Overall Configuration of Radio-Frequency Circuit The radio-frequency circuit 1 according to the first embodiment will be described below with reference to FIG. 1.

The radio-frequency circuit 1 according to the first embodiment is for use in the radio-frequency front-end circuit 200 of the communication apparatus 300 (see FIG. 2), for example. The communication apparatus 300 is a cellular phone (such as a smartphone), for example. The communication apparatus 300 is not restricted to a cellular phone and may be a wearable terminal (such as a smartwatch). The radio-frequency circuit 1 is for use in a radio-frequency module that supports 4G (fourth-generation mobile communication) standards and 5G (fifth-generation mobile communication) standards, for example. 4G is 3GPP LTE (Long Term Evolution) standards, for example. 5G is 5G NR (New Radio), for example. The radio-frequency circuit 1 is a circuit that supports carrier aggregation and dual connectivity, for example.

The radio-frequency circuit 1 according to the first embodiment includes an antenna terminal 2, a first switch 4, a second switch 5, plural (two in this example) first filters 6, plural (two in this example) second filters 7, and an inductor 8. The first switch 4 is connected to the antenna terminal 2. The second switch 5 is connected to the first switch 4 and is connected to the antenna terminal 2 via the first switch 4. The plural second filters 7 are connected to the antenna terminal 2 via the second switch 5 and the first switch 4. The inductor 8 is not connected in series with the plural first filters 6 and is connected in series with the first switch 4 and the second switch 5 between the first switch 4 and the second switch 5. The radio-frequency circuit 1 according to the first embodiment further includes a third switch 3. The third switch 3 is connected to the first switch 4 and is connected to the antenna terminal 2 via the first switch 4. The plural first filters 6 are connected to the first switch 4 via the third switch 3. In the following description, one of the two first filters 6 may be called a first filter 61, while the other first filter 6 may be called a first filter 62. Likewise, one of the two second filters 7 may be called a second filter 71, while the other second filter 7 may be called a second filter 72.

The radio-frequency circuit 1 according to the first embodiment also includes an inductor 9, which is used for providing impedance matching, connected between the antenna terminal 2 and the first switch 4. The radio-frequency circuit 1 according to the first embodiment also includes two shunt inductors 131 and 132 for providing impedance matching between the third switch 3 and the two first filters 6. The radio-frequency circuit 1 according to the first embodiment also includes two shunt inductors 133 and 134 for providing impedance matching between the second switch 5 and the two second filters 7.
(1.2) Elements Forming Radio-Frequency Circuit Hereinafter, the individual elements forming the radio-frequency circuit 1 according to the first embodiment will be explained below.
(1.2.1) Antenna Terminal The antenna terminal 2 is a terminal connected to an antenna 310 (see FIG. 2) disposed outside the radio-frequency circuit 1.
(1.2.2) First Switch The first switch 4 includes a common terminal 40 and plural (two in this example) selection terminals (a first selection terminal 41 and a second selection terminal 42). The first switch 4 changes the connection state between the common terminal 40 and each of the first selection terminal 41 and the second selection terminal 42. The first switch 4 is a switch that switches between a first state, a second state, a third state, and a fourth state. In the first state, the common terminal 40 and the first selection terminal 41 are connected to each other. In the second state, the common terminal 40 and the second selection terminal 42 are connected to each other. In the third state, the common terminal 40 is connected to both of the first selection terminal 41 and the second selection terminal 42. In the fourth state, the common terminal 40 is neither connected to the first selection terminal 41 nor the second selection terminal 42. That is, the first selection terminal 41 and the second selection terminal 42 are connectable to the common terminal 40 at the same time. The first switch 4 is a switch that can connect at least one or more of the plural selection terminals (first selection terminal 41 and second selection terminal 42) to the common terminal 40. The first switch 4 is a switch that implements one-to-one connection and one-to-many connection, for example. The first switch 4 is a switch IC (Integrated Circuit). The switch IC is a one-chip IC chip including a substrate and a switch function unit. The substrate has first and second main surfaces opposing each other in the thickness direction. The switch function unit includes a FET (Field Effect Transistor) formed on the first main surface of the substrate. The substrate is a silicon substrate, for example. The switch function unit has a function of switching the connection state. The first switch 4 is controlled by a signal processing circuit 301 (see FIG. 2), for example.

The first switch 4 changes the connection state between the common terminal 40 and each of the first selection terminal 41 and the second selection terminal 42 in accordance with a control signal from a RF signal processing circuit 302 of the signal processing circuit 301.

The common terminal 40 of the first switch 4 is connected to the antenna terminal 2 via the impedance-matching inductor 9. The first switch 4 is an antenna switch connected to the antenna terminal 2. The first selection terminal 41 of the first switch 4 is connected to the third switch 3 and the second switch 5. In the radio-frequency circuit 1, the inductor 8 is connected in series with the first switch 4 and the second switch 5 between the first selection terminal 41 of the first switch 4 and the second switch 5.

(1.2.3) Second Switch

The second switch 5 includes a common terminal 50 and plural (two in this example) selection terminals (a first selection terminal 51 and a second selection terminal 52). The second switch 5 changes the connection state between the common terminal 50 and each of the first selection terminal 51 and the second selection terminal 52. The second switch 5 is a switch that switches between a first state, a second state, a third state, and a fourth state. In the first state, the common terminal 50 and the first selection terminal 51 are connected to each other. In the second state, the common terminal 50 and the second selection terminal 52 are connected to each other. In the third state, the common terminal 50 is connected to both of the first selection terminal 51 and the second selection terminal 52. In the fourth state, the common terminal 50 is neither connected to the first selection terminal 51 nor the second selection terminal 52. That is, the first selection terminal 51 and the second selection terminal 52 are connectable to the common terminal 50 at the same time. The second switch 5 is a switch that can connect at least one or more of the plural selection terminals (first selection terminal 51 and second selection terminal 52) to the common terminal 50. The second switch 5 is a switch that implements one-to-one connection and one-to-many connection, for example. The second switch 5 is a switch IC. The second switch 5 is controlled by the signal processing circuit 301 (see FIG. 2), for example. The second switch 5 changes the connection state between the common terminal 50 and each of the first selection terminal 51 and the second selection terminal 52 in accordance with a control signal from the RF signal processing circuit 302 of the signal processing circuit 301.

The common terminal 50 of the second switch 5 is connected to the common terminal 40 of the first switch 4 via the inductor 8. The first selection terminal 51 of the second switch 5 is connected to the second filter 71. The second selection terminal 52 of the second switch 5 is connected to the second filter 72. The second switch 5 is a band select switch that switches between signal paths for second communication bands different from each other.

(1.2.4) Third Switch

The third switch 3 includes a common terminal 30 and plural (two in this example) selection terminals (a first selection terminal 31 and a second selection terminal 32). The third switch 3 changes the connection state between the common terminal 30 and each of the first selection terminal 31 and the second selection terminal 32. The third switch 3 is a switch that switches between a first state, a second state, a third state, and a fourth state. In the first state, the common terminal 30 and the first selection terminal 31 are connected to each other. In the second state, the common terminal 30 and the second selection terminal 32 are connected to each other. In the third state, the common terminal 30 is connected to both of the first selection terminal 31 and the second selection terminal 32. In the fourth state, the common terminal 30 is neither connected to the first selection terminal 31 nor the second selection terminal 32. That is, the first selection terminal 31 and the second selection terminal 32 are connectable to the common terminal 30 at the same time. The third switch 3 is a switch that can connect at least one or more of the plural selection terminals (first selection terminal 31 and second selection terminal 32) to the common terminal 30. The third switch 3 is a switch that implements one-to-one connection and one-to-many connection, for example. The third switch 3 is a switch IC. The third switch 3 is controlled by the signal processing circuit 301 (see FIG. 2), for example. The third switch 3 changes the connection state between the common terminal 30 and each of the first selection terminal 31 and the second selection terminal 32 in accordance with a control signal from the RF signal processing circuit 302 of the signal processing circuit 301.

The common terminal 30 of the third switch 3 is connected to the common terminal 40 of the first switch 4 without necessarily having the inductor 8 interposed therebetween. The first selection terminal 31 is connected to the first filter 61. The second selection terminal 32 is connected to the first filter 62. The third switch 3 is a band select switch that switches between signal paths for first communication bands different from each other.

(1.2.5) First Filter and Second Filter

The plural first filters 6 allow radio-frequency signals of first communication bands to pass through the corresponding first filters 6. The plural first filters 6 include the two first filters 61 and 62. The first communication band corresponding to radio-frequency signals to pass through the first filter 61 and the first communication band corresponding to radio-frequency signals to pass through the first filter 62 are different from each other. The first communication band corresponding to radio-frequency signals to pass through the first filter 61 is 3GPP LTE Band 3. The first communication band corresponding to radio-frequency signals to pass through the first filter 62 is 3GPP LTE Band 1. The pass band of the first filter 61 covers Band 3 downlink frequency band (1805 MHz to 1880 MHz). The pass band of the first filter 62 covers Band 1 downlink frequency band (2110 MHz to 2170 MHz). The pass bands of the plural first filters 6 do not overlap each other. Band 1 is a higher frequency communication band than Band 3. In FIG. 1, "B3" indicated on the left side of the symbol of the first filter 61 is to show that the first filter 61 corresponds to Band 3. Likewise, "B1" indicated on the left side of the symbol of the first filter 62 is to show that the first filter 62 corresponds to Band 1.

The plural second filters 7 allow radio-frequency signals of second communication bands to pass through the corresponding second filters 7. The plural second filters 7 include the two second filters 71 and 72. The second communication band corresponding to radio-frequency signals to pass through the second filter 71 and the second communication band corresponding to radio-frequency signals to pass through the second filter 72 are different from each other. The second communication band corresponding to radio-frequency signals to pass through the second filter 71 is 3GPP LTE Band 40. The second communication band corresponding to radio-frequency signals to pass through the second filter 72 is 3GPP LTE Band 7. The pass band of the second filter 71 covers Band 40 downlink frequency band (2300 MHz to 2400 MHz). The pass band of the second filter 72 covers Band 7 downlink frequency band (2620 MHz to 2690 MHz). The pass bands of the plural second filters 7 do not overlap each other. Band 7 is a higher frequency communication band than Band 40. In FIG. 1, "B40" indicated on the left side of the symbol of the second filter 71 is to show that the second filter 71 corresponds to Band 40. Likewise, "B7" indicated on the left side of the symbol of the second filter 72 is to show that the second filter 72 corresponds to Band 7.

Each of the first filters 61 and 62 and the second filters 71 and 72 is an acoustic wave filter. The acoustic wave filter is a SAW (Surface Acoustic Wave) filter using surface acoustic waves, for example.

The first filter 61 is connected to the first selection terminal 31 of the third switch 3 via a wiring 101. The first filter 62 is connected to the second selection terminal 32 of the third switch 3 via a wiring 102. The second filter 71 is connected to the first selection terminal 51 of the second switch 5 via a wiring 103. The second filter 72 is connected to the second selection terminal 52 of the second switch 5 via a wiring 104.

The inductor 8 is connected in series with the second switch 5 and the first switch 4 between the common terminal 50 of the second switch 5 and the first selection terminal 41 of the first switch 4. The inductance of the inductor 8 is 1 nH or higher, and 1.5 nH, for example.

(1.2.6) Shunt Inductor

The shunt inductor 131 is an element forming a matching circuit for providing impedance matching between the third switch 3 and the first filter 61. The shunt inductor 131 is connected between a node N11 on the wiring 101 and a ground.

The shunt inductor 132 is an element forming a matching circuit for providing impedance matching between the third switch 3 and the first filter 62. The shunt inductor 132 is connected between a node N12 on the wiring 102 and a ground.

The shunt inductor 133 is an element forming a matching circuit for providing impedance matching between the second switch 5 and the second filter 71. The shunt inductor 133 is connected between a node N13 on the wiring 103 and a ground.

The shunt inductor 134 is an element forming a matching circuit for providing impedance matching between the second switch 5 and the second filter 72. The shunt inductor 134 is connected between a node N14 on the wiring 104 and a ground.

(1.3) Operation of Radio-Frequency Circuit

When simultaneous communication of Band 3, Band 1, Band 40, and Band 7, for example, is performed, in the radio-frequency circuit 1, the first selection terminal 41 is connected to the common terminal 40 in the first switch 4, and the first selection terminal 31 and the second selection terminal 32 are connected to the common terminal 30 at the same time in the third switch 3, and the first selection terminal 51 and the second selection terminal 52 are connected to the common terminal 50 at the same time in the second switch 5.

When simultaneous communication of Band 3, Band 1, and Band 40, for example, is performed, in the radio-frequency circuit 1, the first selection terminal 41 is connected to the common terminal 40 in the first switch 4, and the first selection terminal 31 and the second selection terminal 32 are connected to the common terminal 30 at the same time in the third switch 3, and the first selection terminal 51 is connected to the common terminal 50 in the second switch 5.

When simultaneous communication of Band 3 and Band 1, for example, is performed, in the radio-frequency circuit 1, the first selection terminal 41 is connected to the common terminal 40 in the first switch 4, and the first selection terminal 31 and the second selection terminal 32 are connected to the common terminal 30 at the same time in the third switch 3.

When simultaneous communication of Band 40 and Band 7, for example, is performed, in the radio-frequency circuit 1, the first selection terminal 41 is connected to the common terminal 40 in the first switch 4, and the first selection terminal 51 and the second selection terminal 52 are connected to the common terminal 50 at the same time in the second switch 5.

When Band 40 communication, for example, is performed, in the radio-frequency circuit 1, the first selection terminal 41 is connected to the common terminal 40 in the first switch 4, and the first selection terminal 51 is connected to the common terminal 50 in the second switch 5.

When Band 7 communication, for example, is performed, in the radio-frequency circuit 1, the first selection terminal 41 is connected to the common terminal 40 in the first switch 4, and the second selection terminal 52 is connected to the common terminal 50 in the second switch 5.

(1.4) Radio-Frequency Module Including Radio-Frequency Circuit

A radio-frequency module including the radio-frequency circuit 1 of the first embodiment includes the above-described antenna terminal 2, first switch 4, second switch 5, two first filters 6, two second filters 7, inductor 8, inductor 9, and four shunt inductors 131 through 134. The radio-frequency module also includes a mounting substrate on which the first switch 4, the second switch 5, the two first filters 6, the two second filters 7, the inductors 8 and 9, and the four shunt inductors 131 through 134, for example, are mounted.

The mounting substrate has first and second main surfaces which oppose each other in the thickness direction of the mounting substrate. The mounting substrate is a printed wiring board, a LTCC (Low Temperature Co-fired Ceramics) substrate, a HTCC (High Temperature Co-fired Ceramics) substrate, or a resin multilayer substrate, for example. The mounting substrate is a multilayer substrate including multiple dielectric layers and multiple conductive layers, for example. The multiple dielectric layers and the multiple conductive layers are stacked on each other in the thickness direction of the mounting substrate. The multiple conductive layers are each formed in a predetermined pattern and each includes one or plural conductors in a plane perpendicular to the thickness direction of the mounting substrate. The material for each conductive layer is copper, for example. The multiple conductive layers include ground layers. In the radio-frequency module, plural ground terminals and the ground layers are electrically connected to each other using via-conductors, for example, included in the mounting substrate.

The mounting substrate is not limited to a printed wiring board or a LTCC substrate and may be a wiring structure. The wiring structure is a multilayer structure, for example. The multilayer structure includes at least one insulating layer and at least one conductive layer. The insulating layer is formed in a predetermined pattern. If plural insulating layers are provided, each insulating layer is formed in a predetermined pattern. The conductive layer is formed in a predetermined pattern different from the pattern of the insulating layer. If plural conductive layers are provided, each conductive layer is formed in a predetermined pattern. The conductive layer may include one or plural rewiring sections. The wiring structure has first and second surfaces which oppose each other in the thickness direction of the multilayer structure. The first surface corresponds to the first main surface of the mounting substrate, while the second surface corresponds to the second main surface of the mounting substrate. The wiring structure may be an interposer. The interposer may be an interposer using a silicon substrate or a multilayer substrate.

The acoustic wave filter includes a piezoelectricity substrate and multiple IDT (Interdigital Transducer) electrodes. The multiple IDT electrodes are formed on the piezoelectricity substrate. Each of the multiple IDT electrodes includes a first electrode and a second electrode. The first electrode includes multiple first electrode fingers and a first busbar to which the multiple first electrode fingers are connected. The second electrode includes multiple second electrode fingers and a second busbar to which the multiple second electrode fingers are connected. The characteristics of the acoustic wave filter can be changed by suitably adjusting the electrode finger pitch of the IDT electrodes, the intersecting width of the IDT electrodes, and the material for the piezoelectricity substrate, for example. The electrode finger pitch of the IDT electrodes is defined by the center-to-center distance of two adjacent first electrode fingers among the multiple first electrode fingers or by the center-to-center distance of two adjacent second electrode fingers among the multiple second electrode fingers. The acoustic wave filter is, for example, a ladder filter including plural surface acoustic wave resonators (plural series arm resonators and plural parallel arm resonators). Each of the plural surface acoustic wave resonators includes IDT electrodes and part of the piezoelectricity substrate. The piezoelectricity substrate is a piezoelectric substrate. The material for the piezoelectric substrate is lithium tantalate ($LiTaO_3$) or lithium niobate ($LiNbO_3$), for example. The piezoelectricity substrate is not limited to a piezoelectric substrate and may be a multilayer substrate including a support substrate, a low acoustic velocity film disposed on the support substrate, and a piezoelectric layer disposed on the low acoustic velocity film. The acoustic velocity of a bulk wave propagating through the low acoustic velocity film is lower than that of a bulk wave propagating through the piezoelectric layer. The material for the low acoustic velocity film is silicon oxide, for example. The material for the low acoustic velocity film is not restricted to silicon oxide and may be silicon oxide, glass, silicon oxynitride, tantalum oxide, or a compound obtained by adding fluorine, carbon, or boron to silicon oxide, or a material having the above-described any of substance or compound as a main constituent, for example. The acoustic velocity of a bulk wave propagating through the support substrate is higher than that of an acoustic wave propagating through the piezoelectric layer. The acoustic velocity of the bulk wave propagating through the support substrate is the lowest bulk wave among plural bulk waves which may propagate through the support substrate. The material for the support substrate is at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

The multilayer substrate forming the piezoelectricity substrate may also include a high acoustic velocity film disposed between the support substrate and the low acoustic velocity film. The acoustic velocity of a bulk wave propagating through the high acoustic velocity film is higher than that of an acoustic wave propagating through the piezoelectric layer. The material for the high acoustic velocity film is at least one material selected from the group consisting of diamond-like carbon, aluminum nitride, aluminum oxide, silicon carbide, silicon nitride, silicon, sapphire, piezoelectric materials (lithium tantalate, lithium niobate, or quartz), alumina, zirconia, cordierite, mullite, steatite, forsterite, magnesia, and diamond, for example. Alternatively, the material for the high acoustic velocity film may be a medium made of any of the above-described materials as a main constituent or a medium made of a mixture of any of the above-described materials as a main constituent.

The inductor 8 is a chip inductor, for example. However, the inductor 8 is not limited to a chip inductor and may be an inductor formed in or on a multilayer substrate and including conductive patterns. The inductance of the inductor 8 is 1 nH or higher, as discussed above. An inductor including conductive patterns can be wound by at least two turns about a winding axis extending along the thickness direction of the multilayer substrate. An inductor including conductive patterns may be an inner-layer inductor, the entirety of which is disposed in the multilayer substrate, or may be partially formed on the main surface of the multilayer substrate.

(2) Reference Examples

Figure 6:
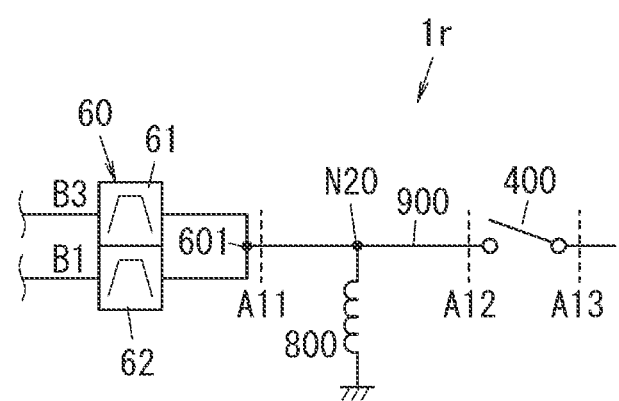
FIG. 6 is a circuit diagram of a radio-frequency circuit according to a first reference example.

Before explaining the radio-frequency circuit 1 according to the first embodiment in greater details, a description will be given of issues to be addressed when a radio-frequency circuit 1r (see FIG. 6) according to a first reference example and a radio-frequency circuit 1s (see FIG. 8) according to a second reference example support simultaneous communication, such as carrier aggregation. In the explanation of the radio-frequency circuit 1r according to the first reference example and the radio-frequency circuit 1s according to the second reference example, elements similar to those of the radio-frequency circuit 1 according to the first embodiment are designated by like reference numerals and an explanation thereof will be omitted suitably.

(2.1) First Reference Example

The radio-frequency circuit 1r according to the first reference example includes a multiplexer 60 having two first filters 61 and 62, a switch 400, and a shunt inductor 800. The multiplexer 60 has a node 601 which links the input terminals (terminals on the side of the antenna terminal) of the two first filters 61 and 62. In the radio-frequency circuit 1r according to the first reference example, the node 601 of the multiplexer 60 is connected to the antenna terminal via the switch 400. The shunt inductor 800 is connected between a ground and a node N20 located on a wiring 900 which connects the node 601 and the switch 400.

The pass band of the first filter 61 covers Band 3 downlink frequency band. The pass band of the first filter 62 covers Band 1 downlink frequency band. If a combination of Band 3 and Band 1 is used typically in carrier aggregation, to improve the characteristics of the first filters 61 and 62, it is suitable that the first filter 61 using Band 3 and the first filter 62 using Band 1 in the multiplexer 60 be linked together without necessarily using the switch 400 than that the first filters 61 and 62 in the multiplexer 60 be linked together via the switch 400.

Figure 7A:
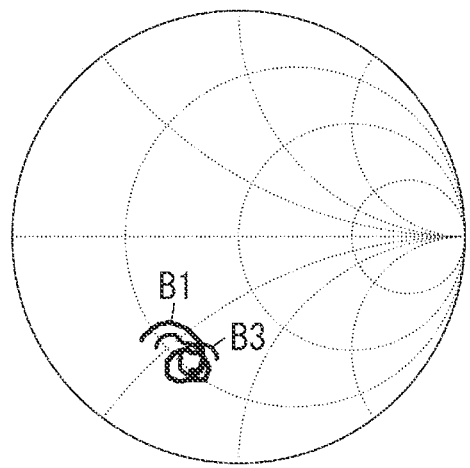
FIG. 7A is a Smith chart of individual filters seen from a point on a line A11 in the radio-frequency circuit shown in FIG. 6.
Figure 7B:
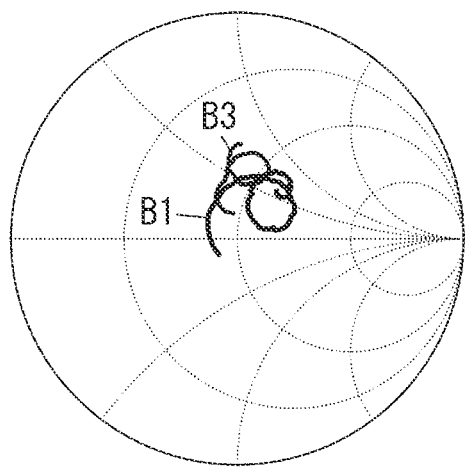
FIG. 7B is a Smith chart of the individual filters seen from a point on a line A12 in the radio-frequency circuit shown in FIG. 6.
Figure 7C:
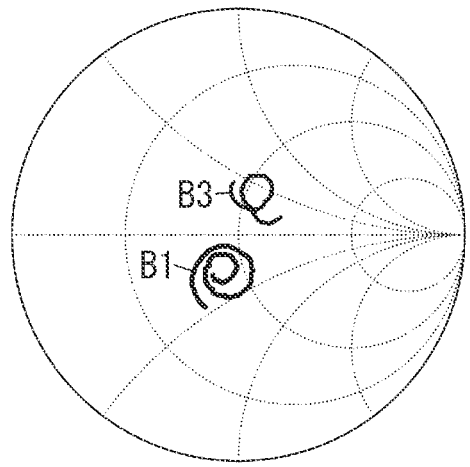
FIG. 7C is a Smith chart of the individual filters seen from a point on a line A13 in the radio-frequency circuit shown in FIG. 6.

FIG. 7A is a Smith chart illustrating the impedance of each of the first filters 61 and 62 in the radio-frequency circuit 1r when the first filters 61 and 62 are seen from a point (point on a line A11) between the node 601 of the multiplexer 60 and the node N20. FIG. 7B is a Smith chart illustrating the impedance of each of the first filters 61 and 62 in the radio-frequency circuit 1*r* when the first filters 61 and 62 are seen from a point (point on a line A12) between the node N20 and the switch 400. FIG. 7C is a Smith chart illustrating the impedance of each of the first filters 61 and 62 seen from a point (point on a line A13) between the switch 400 and the antenna terminal when the radio-frequency circuit 1*r* supports simultaneous communication of Band 3 and Band 1 (in this case, the switch 400 is ON).

In each of FIGS. 7A through 7C, the straight line passing through the center of the chart in the horizontal direction is the axis (resistance axis) representing resistance components of the impedance. The scale on the resistance axis is normalized: the left end is 0Ω; the center of the chart is 50Ω; and the right end is infinite (open). In each of FIGS. 7A through 7C, with respect to the resistance axis, the lower side is capacitive and the upper side is inductive.

As is seen from FIGS. 7A and 7B, the impedance of the first filter 61 alone in Band 3 is capacitive as shown in FIG. 7A and shifts to the inductive side due to the influence of the shunt inductor 800 as shown in FIG. 7B. As is seen from FIGS. 7A and 7B, the impedance of the first filter 62 alone in Band 1 is capacitive as shown in FIG. 7A and shifts to the inductive side due to the influence of the shunt inductor 800 as shown in FIG. 7B. The shift amount is 1/ωL where L is the inductance of the shunt inductor 800 and ω is the angular frequency. The shift amount of the impedance of the first filter 61 using Band 3, which is lower than Band 1, is greater than that of the first filter 62 using Band 1, which is higher than Band 3.

FIGS. 7B and 7C show that the impedance of the first filter 61 in Band 3 is shifted due to the influence of a shunt capacitor of the wiring 901 and a shunt capacitor of the switch 400. FIGS. 7B and 7C also show that the impedance of the first filter 62 in Band 1 is shifted due to the influence of the shunt capacitor of the wiring 901 and the shunt capacitor of the switch 400. The shift amount is ωC where C is the capacitance of the shunt capacitors and w is the angular frequency. The shift amount of the impedance of the first filter 62 using Band 1, which is higher than Band 3, is greater than that of the first filter 61 using Band 3. FIG. 7C shows that the impedance of the first filter 61 in Band 3 deviates from 50Ω toward the inductive side and that the impedance of the first filter 62 in Band 1 deviates from 50Ω toward the capacitive side. Hence, when an inductor is connected between the switch 400 and the antenna terminal, the impedance of the first filter 61 whose pass band covers Band 3 having a lower frequency band is likely to shift toward at least one of the higher impedance side and the inductive side, while the impedance of the first filter 62 whose pass band covers Band 1 having a higher frequency band is likely to shift toward at least one of the lower impedance side and the capacitive side.

(2.2) Second Reference Example

Figure 8:
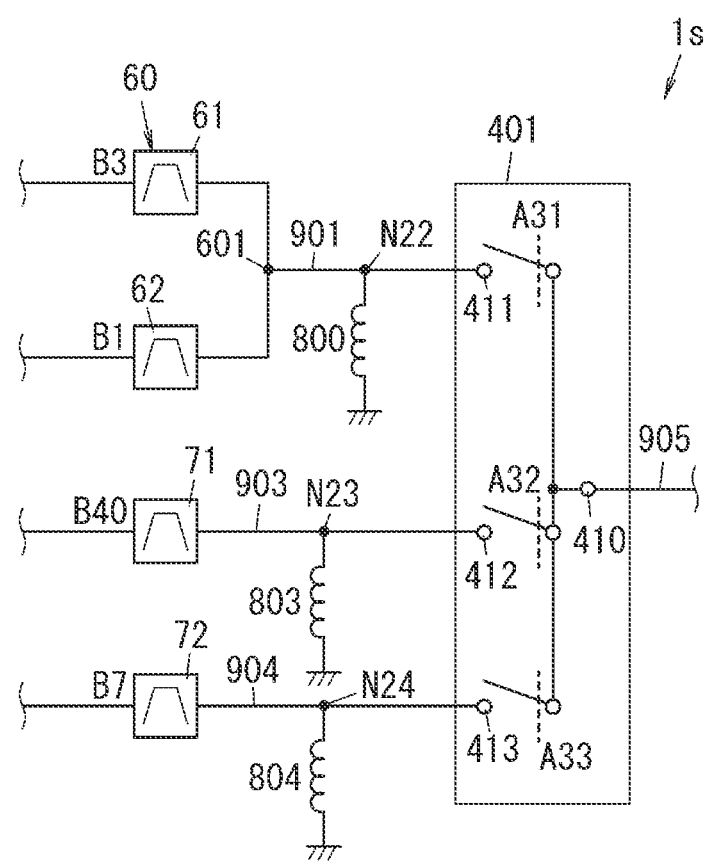
FIG. 8 is a circuit diagram of a radio-frequency circuit according to a second reference example.

As shown in FIG. 8, the radio-frequency circuit 1*s* according to the second reference example includes two second filters 71 and 72 and two shunt inductors 803 and 804 in addition to the elements of the radio-frequency circuit 1*r* according to the first reference example. The radio-frequency circuit 1*s* according to the second reference example includes a switch 401 instead of the switch 400 of the radio-frequency circuit 1*r* of the first reference example.

The pass band of the first filter 61 covers Band 3 downlink frequency band. The pass band of the first filter 62 covers Band 1 downlink frequency band. The pass band of the second filter 71 covers Band 40 downlink frequency band. The pass band of the second filter 72 covers Band 7 downlink frequency band.

The switch 401 includes a common terminal 410 and three selection terminals 411, 412, and 413 that are connectable to the common terminal 410 at the same time. The switch 401 is a switch that implements one-to-one connection and one-to-many connection. The common terminal 410 is connected to the antenna terminal via a wiring 905 and an impedance-matching inductor. The selection terminal 411 is connected to the node 601 of the multiplexer 60 via a wiring 901 and is thus connected to the first filters 61 and 62. The selection terminal 412 is connected to the second filter 71 via a wiring 903. The selection terminal 413 is connected to the second filter 72 via a wiring 904.

In the radio-frequency circuit 1*s*, the shunt inductor 800 is connected between a ground and a node N22 located on a wiring 901 between the node 601 of the multiplexer 60 and the selection terminal 411 of the switch 401. The shunt inductor 803 is connected between a ground and a node N23 located on a wiring 903 between the second filter 71 and the selection terminal 412 of the switch 401. The shunt inductor 804 is connected between a ground and a node N24 located on a wiring 904 between the second filter 72 and the selection terminal 413 of the switch 401.

When simultaneous communication of Band 3, Band 1, and Band 40, for example, is performed, in the radio-frequency circuit 1*s*, the two selection terminals 411 and 412 are connected to the common terminal 410 at the same time. When simultaneous communication of Band 3, Band 1, Band 40, and Band 7, for example, is performed, in the radio-frequency circuit 1*s*, the three selection terminals 411 through 413 are connected to the common terminal 410 at the same time. When Band 40 communication alone is performed, in the radio-frequency circuit 1*s*, the selection terminal 412 among the three selection terminals 411 through 413 is connected to the common terminal 410.

Figure 9A:
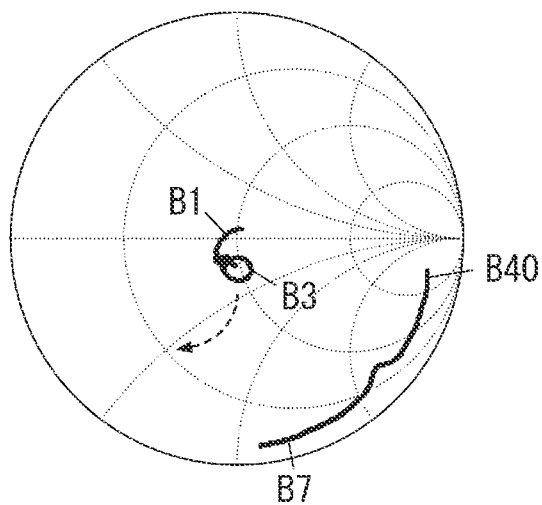
FIG. 9A is a Smith chart of first filters seen from a point on a line A31 in the radio-frequency circuit shown in FIG. 8.
Figure 9B:
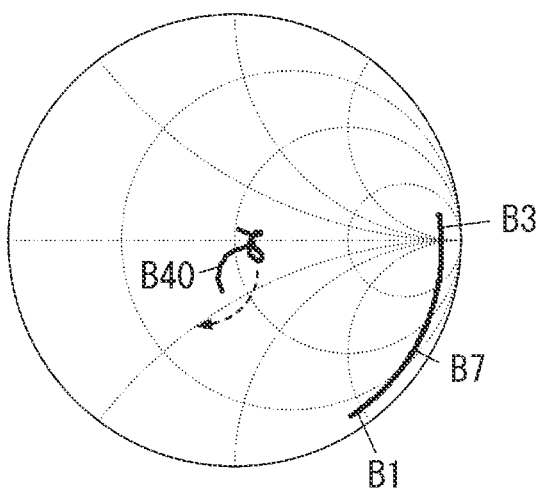
FIG. 9B is a Smith chart of a second filter seen from a point on a line A32 in the radio-frequency circuit shown in FIG. 8.
Figure 9C:
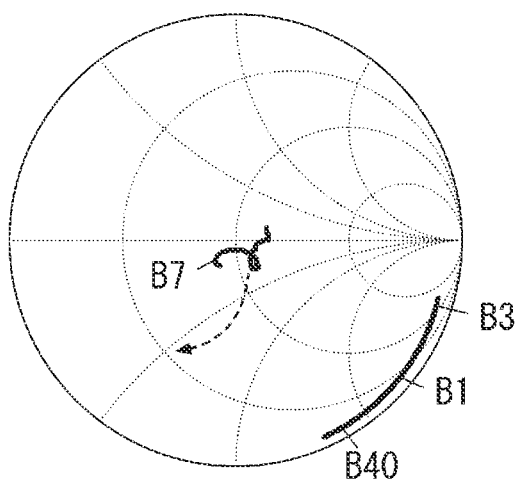
FIG. 9C is a Smith chart of a second filter seen from a point on a line A33 in the radio-frequency circuit shown in FIG. 8.

FIG. 9A is a Smith chart illustrating the impedances of the first filters 61 and 62 in the radio-frequency circuit 1*s* when the multiplexer 60 is seen from a point (point on a line A31) on the side of the common terminal 410 of the switch 401. B3, B1, B40, and B7 indicated in FIG. 9A represent the impedances of the first filters 61 and 62 in the frequency bands of Band 3, Band 1, Band 40, and Band 7, respectively. FIG. 9B is a Smith chart illustrating the impedances of the second filter 71 in the radio-frequency circuit 1*s* when the second filter 71 is seen from a point (point on a line A32) on the side of the common terminal 410 of the switch 401. B3, B1, B40, and B7 indicated in FIG. 9B represent the impedances of the second filter 71 in the frequency bands of Band 3, Band 1, Band 40, and Band 7, respectively. FIG. 9C is a Smith chart illustrating the impedances of the second filter 72 in the radio-frequency circuit 1*s* when the second filter 72 is seen from a point (point on a line A33) on the side of the common terminal 410 of the switch 401. B3, B1, B40, and B7 indicated in FIG. 9C represent the impedances of the second filter 72 in the frequency bands of Band 3, Band 1, Band 40, and Band 7, respectively.

In the Smith chart of FIG. 9A, the impedance of the first filter 62 that allows radio-frequency signals in Band 1 to pass therethrough is close to 50Ω. In the Smith chart of FIG. 9A, the impedance of the first filter 62 in the frequency band of Band 40 is capacitive, while the impedance of the first filter 62 in the frequency band of Band 7 is capacitive having a lower reactance than that in Band 40. The impedance of the first filter 62 in the frequency band of Band 1 is thus influenced by a shunt capacitor. When simultaneous communication of Band 3, Band 1, Band 40, and Band 7 is performed, the impedance of the first filter 62 that allows radio-frequency signals in Band 1 to pass therethrough results in the value obtained by connecting capacitance components of the second filter 71 in the frequency band of Band 1 and those of the second filter 72 in the frequency band of Band 1 in parallel with the first filter 62. Hence, when simultaneous communication is performed, the impedance of the first filter 62 shifts from the impedance of the first filter 62 alone toward at least one of the lower impedance side and the capacitive side, as indicated by the broken-line arrow in FIG. 9A.

In the Smith chart of FIG. 9A, the impedance of the first filter 61 that allows radio-frequency signals in Band 3 to pass therethrough is close to 50Ω. In the Smith chart of FIG. 9A, the impedance of the first filter 61 in the frequency band of Band 40 and that in Band 7 are nearly open. Hence, when simultaneous communication of Band 3, Band 1, Band 40, and Band 7 is performed, the impedance of the first filter 61 that allows radio-frequency signals in Band 3 to pass therethrough is hardly influenced, in terms of the phase, by the first filter 62, the second filter 71, and the second filter 72 using Band 1, Band 40, and Band 7, respectively. The impedance of the first filter 61 that allows radio-frequency signals in Band 3 to pass therethrough thus almost remains the same even when the first filters 61 and 62 and the second filters 71 and 72 are linked together. It may be possible that the impedance of the first filter 61 that allows radio-frequency signals in Band 3 to pass therethrough shift toward at least one of the higher impedance side and the inductive side due to the influence of the inductor connected between the common terminal 410 of the switch 401 and the antenna terminal.

In the Smith chart of FIG. 9B, the impedance of the second filter 71 that allows radio-frequency signals in Band 40 to pass therethrough is close to 50Ω. In the Smith chart of FIG. 9B, the impedance of the second filter 71 in the frequency band of Band 3 is almost open and inductive, while that in Band 7 is capacitive. When simultaneous communication of Band 3, Band 1, Band 40, and Band 7 is performed, the impedance of the second filter 71 that allows radio-frequency signals in Band 40 to pass therethrough is thus influenced by the shunt capacitor (shunt capacitance components of the wiring 905 and those of the switch 401) and shifts toward at least one of the lower impedance side and the capacitive side, as indicated by the broken-line arrow in FIG. 9B.

In the Smith chart of FIG. 9C, the impedance of the second filter 72 that allows radio-frequency signals in Band 7 to pass therethrough is close to 50Ω. In the Smith chart of FIG. 9C, the impedances of the second filter 72 in the frequency bands of all of Band 3, Band 1, and Band 40 are capacitive. When simultaneous communication of Band 3, Band 1, Band 40, and Band 7 is performed, the impedance of the second filter 72 that allows radio-frequency signals in Band 7 to pass therethrough is thus influenced by the shunt capacitor (shunt capacitance components of the wiring 905 and those of the switch 401) and is likely to shift toward at least one of the lower impedance side and the capacitive side, as indicated by the broken-line arrow in FIG. 9C.

As is seen from FIGS. 9A through 9C, when simultaneous communication of multiple bands, that is, Band 3, Band 1, Band 40, and Band 7, is performed using the switch 401, the impedance of the first filter 61 using a relatively low-frequency communication band tends to shift from 50Ω toward at least one of the higher impedance side and the inductive side, while the impedances of the first filter 62 and the second filters 71 and 72 using relatively high-frequency communication bands tend to shift from 50Ω toward at least one of the lower impedance side and the capacitive side. The impedance of the second filter 72 that allows radio-frequency signals in Band 7, which is the highest frequency band among Band 3, Band 1, Band 40, and Band 7, to pass therethrough is most likely to shift from 50Ω toward at least one of the lower impedance side and the capacitive side.

As described above, in the radio-frequency circuit 1r according to the first reference example and the radio-frequency circuit 1s according to the second reference example, when simultaneous communication, such as carrier aggregation, is performed, among the impedances of plural filters seen from the antenna terminal, the impedance of a lower-frequency band filter tends to shift toward at least one of the higher impedance side and the inductive side, while the impedance of a higher-frequency band filter tends to shift toward at least one of the lower impedance side and the capacitive side. Hence, when simultaneous communication, such as carrier aggregation, is performed, in the radio-frequency circuit 1r according to the first reference example and the radio-frequency circuit 1s according to the second reference example, variations among impedances of plural filters in communication bands thereof are increased.

(3) Characteristics of Radio-Frequency Circuit

In the radio-frequency circuit 1 according to the first embodiment, the inductor 8 is connected in series between the second switch 5, which is a band select switch for switching between multiple (two in this example) higher radio-frequency second communication bands (Band 40 and Band 7), and the first switch 4, which is an antenna switch. With this configuration, the characteristics of the radio-frequency circuit 1 of the first embodiment exhibited in response to simultaneous communication, such as carrier aggregation, for example, become different from those of the radio-frequency circuit 1s of the second reference example exhibited in response to simultaneous communication, such as carrier aggregation.

A description of the Smith charts shown in FIGS. 3A through 3D regarding the radio-frequency circuit 1 of the first embodiment will be given after explaining the Smith charts shown in FIGS. 5A through 5D regarding a radio-frequency circuit 1q of a first comparative example shown in FIG. 4. The radio-frequency circuit 1q according to the first comparative example is different from the radio-frequency circuit 1 according to the first embodiment in that it does not include the inductor 8.

Figure 4:
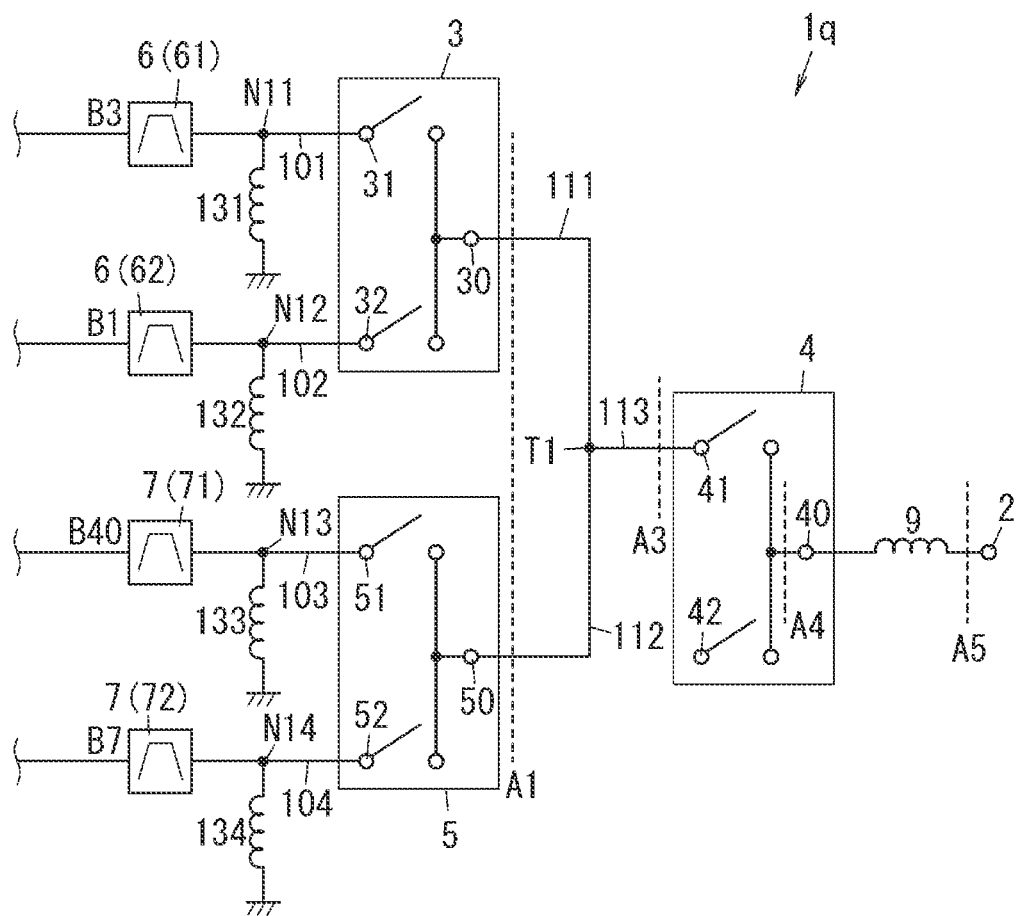
FIG. 4 is a circuit diagram of a radio-frequency circuit according to a first comparative example.
Figure 5A:
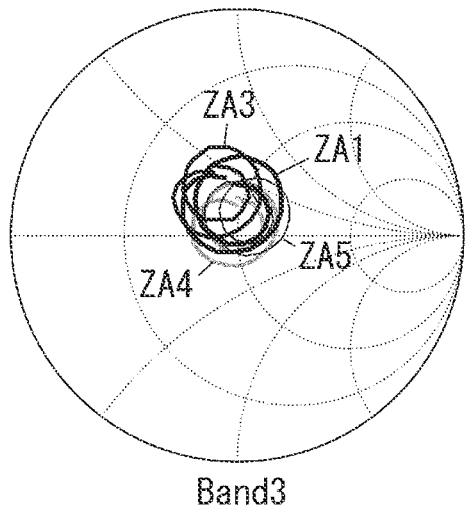
FIG. 5A is a Smith chart of a Band 3 filter in the radio-frequency circuit shown in FIG. 4.

FIG. 5A is a Smith chart illustrating the impedances of the first filter 61 that allows radio-frequency signals in Band 3 to pass therethrough. In FIG. 5A, ZA1 indicates the impedance of the first filter 61 in the frequency band of Band 3 when the first filter 61 is seen from a point on a first wiring 111 (point on a line A1) connected to the common terminal 30 of the third switch 3 in FIG. 4. In FIG. 5A, ZA3 indicates the impedance of the first filter 61 in the frequency band of Band 3 when the first filter 61 is seen from a point on a third wiring 113 (point on a line A3) in FIG. 4. The third wiring 113 is a wiring which connects the first selection terminal 41 of the first switch 4 and a node T1 between the first wiring 111 connected to the common terminal 30 and a wiring 112 connected to the common terminal 50. In FIG. 5A, ZA4 indicates the impedance of the first filter 61 in the frequency band of Band 3 when the first filter 61 is seen from a point on the side of the common terminal 40 of the first switch 4 (point on a line A4) in FIG. 4. In FIG. 5A, ZA5 indicates the impedance of the first filter 61 in the frequency band of Band 3 when the first filter 61 is seen from a point between the inductor 9 and the antenna terminal 2 (point on a line A5) in FIG. 4. That is, in FIG. 5A, ZA5 indicates the impedance of the first filter 61 when the first filter 61 is seen from the antenna terminal 2. In FIG. 5A, the reason why ZA3 is positioned farther toward the inductive side than ZA1 is that the impedance of the second filter 72 that allows radio-frequency signals in Band 40 to pass therethrough is inductive in Band 3.

Figure 5B:
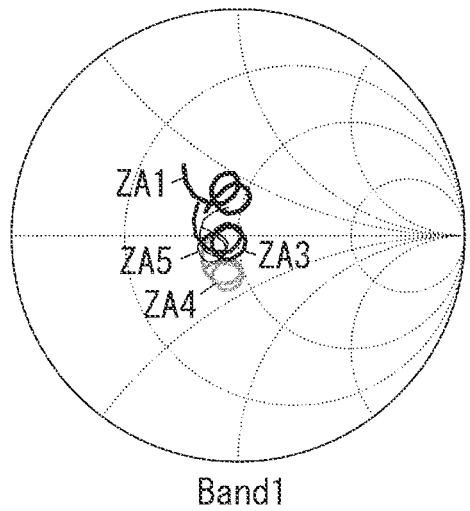
FIG. 5B is a Smith chart of a Band 1 filter in the radio-frequency circuit shown in FIG. 5.

FIG. 5B is a Smith chart illustrating the impedances of the first filter 62 that allows radio-frequency signals in Band 1 to pass therethrough. In FIG. 5B, ZA1 indicates the impedance of the first filter 62 in the frequency band of Band 1 when the first filter 62 is seen from a point on the first wiring 111 (point on the line A1) connected to the common terminal 30 of the third switch 3 in FIG. 4. In FIG. 5B, ZA3 indicates the impedance of the first filter 62 in the frequency band of Band 1 when the first filter 62 is seen from a point on the third wiring 113 (point on the line A3) in FIG. 4. In FIG. 5B, ZA4 indicates the impedance of the first filter 62 in the frequency band of Band 1 when the first filter 62 is seen from a point on the side of the common terminal 40 of the first switch 4 (point on the line A4) in FIG. 4. In FIG. 5B, ZA5 indicates the impedance of the first filter 62 in the frequency band of Band 1 when the first filter 62 is seen from a point between the inductor 9 and the antenna terminal 2 (point on the line A5) in FIG. 4. That is, in FIG. 5B, ZA5 indicates the impedance of the first filter 62 when the first filter 62 is seen from the antenna terminal 2 in FIG. 4.

Figure 5C:
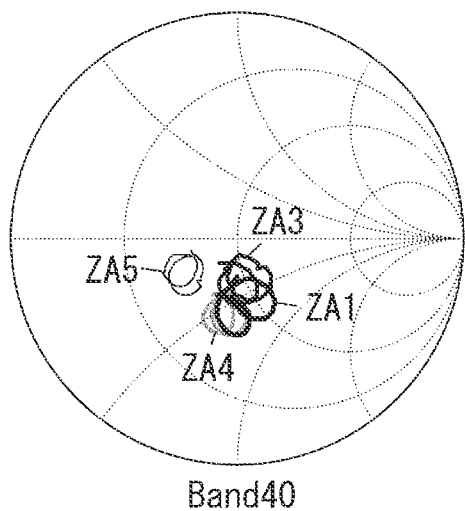
FIG. 5C is a Smith chart of a Band 40 filter in the radio-frequency circuit shown in FIG. 4.

FIG. 5C is a Smith chart illustrating the impedances of the second filter 71 that allows radio-frequency signals in Band 40 to pass therethrough. In FIG. 5C, ZA1 indicates the impedance of the second filter 71 in the frequency band of Band 40 when the second filter 71 is seen from a point on the first wiring 111 (point on the line A1) connected to the common terminal 30 of the third switch 3 in FIG. 4. In FIG. 5C, ZA3 indicates the impedance of the second filter 71 in the frequency band of Band 40 when the second filter 71 is seen from a point on the third wiring 113 (point on the line A3) in FIG. 4. In FIG. 5C, ZA4 indicates the impedance of the second filter 71 in the frequency band of Band 40 when the second filter 71 is seen from a point on the side of the common terminal 40 of the first switch 4 (point on the line A4) in FIG. 4. In FIG. 5C, ZA5 indicates the impedance of the second filter 71 in the frequency band of Band 40 when the second filter 71 is seen from a point between the inductor 9 and the antenna terminal 2 (point on the line A5) in FIG. 4. That is, in FIG. 5C, ZA5 indicates the impedance of the second filter 71 when the second filter 71 is seen from the antenna terminal 2 in FIG. 4.

Figure 5D:
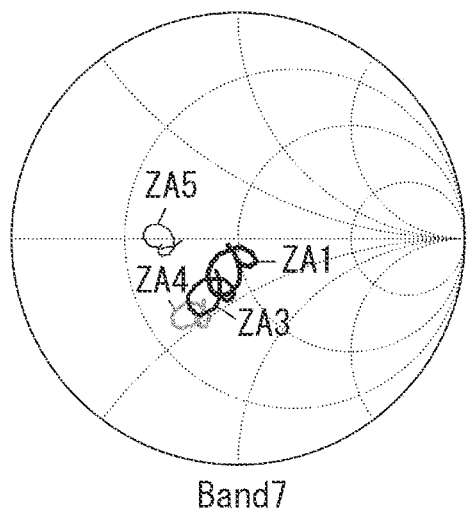
FIG. 5D is a Smith chart of a Band 7 filter in the radio-frequency circuit shown in FIG. 4.

FIG. 5D is a Smith chart illustrating the impedances of the second filter 72 that allows radio-frequency signals in Band 7 to pass therethrough. In FIG. 5D, ZA1 indicates the impedance of the second filter 72 in the frequency band of Band 7 when the second filter 72 is seen from a point on the first wiring 111 (point on the line A1) connected to the common terminal 30 of the third switch 3 in FIG. 4. In FIG. 5D, ZA3 indicates the impedance of the second filter 72 in the frequency band of Band 7 when the second filter 72 is seen from a point on the third wiring 113 (point on the line A3) in FIG. 4. In FIG. 5D, ZA4 indicates the impedance of the second filter 72 in the frequency band of Band 7 when the second filter 72 is seen from a point on the side of the common terminal 40 of the first switch 4 (point on the line A4) in FIG. 4. In FIG. 5D, ZA5 indicates the impedance of the second filter 72 in the frequency band of Band 7 when the second filter 72 is seen from a point between the inductor 9 and the antenna terminal 2 (point on the line A5) in FIG. 4. That is, in FIG. 5D, ZA5 indicates the impedance of the second filter 72 when the second filter 72 is seen from the antenna terminal 2 in FIG. 4. In FIG. 5D, the reason why ZA3 is positioned farther toward the capacitive side than ZA1 is that the impedance of the first filter 61 that allows radio-frequency signals in Band 3 to pass therethrough is capacitive in Band 7 and that the impedance of the first filter 62 that allows radio-frequency signals in Band 1 to pass therethrough is capacitive in Band 7. In FIG. 5D, the reason why ZA4 is positioned farther toward the capacitive side than ZA3 is due to the capacitance components of the first switch 4.

Figure 3A:
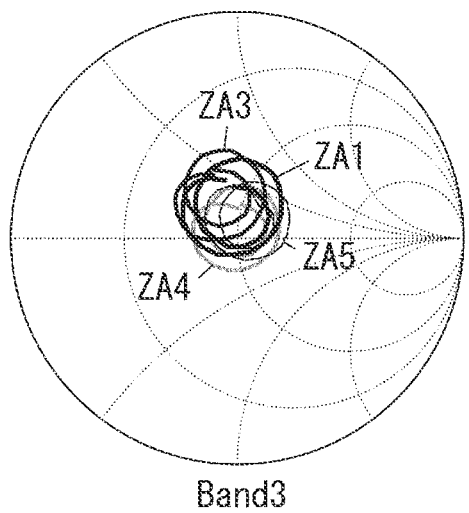
FIG. 3A is a Smith chart of a Band 3 filter in the radio-frequency circuit shown in FIG. 1.

FIG. 3A is a Smith chart illustrating the impedances of the first filter 61 that allows radio-frequency signals in Band 3 to pass therethrough. In FIG. 3A, ZA1 indicates the impedance of the first filter 61 in the frequency band of Band 3 when the first filter 61 is seen from a point on a first wiring 111 (point on a line A1) connected to the common terminal 30 of the third switch 3 in FIG. 1. In FIG. 3A, ZA3 indicates the impedance of the first filter 61 in the frequency band of Band 3 when the first filter 61 is seen from a point on a third wiring 113 (point on a line A3) in FIG. 1. The third wiring 113 is a wiring which connects the first selection terminal 41 of the first switch 4 and the node T1 between the first wiring 111 connected to the common terminal 30 and a wiring 112 connected to the common terminal 50. In FIG. 3A, ZA4 indicates the impedance of the first filter 61 in the frequency band of Band 3 when the first filter 61 is seen from a point on the side of the common terminal 40 of the first switch 4 (point on a line A4) in FIG. 1. In FIG. 3A, ZA5 indicates the impedance of the first filter 61 in the frequency band of Band 3 when the first filter 61 is seen from a point between the inductor 9 and the antenna terminal 2 (point on a line A5) in FIG. 1. That is, in FIG. 3A, ZA5 indicates the impedance of the first filter 61 when the first filter 61 is seen from the antenna terminal 2 in FIG. 1.

Figure 3B:
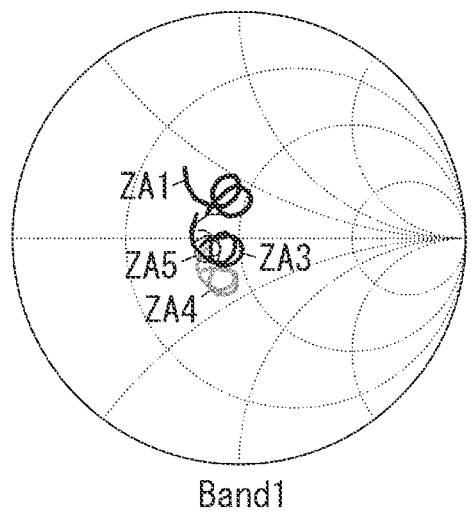
FIG. 3B is a Smith chart of a Band 1 filter in the radio-frequency circuit shown in FIG. 1.

FIG. 3B is a Smith chart illustrating the impedances of the first filter 62 that allows radio-frequency signals in Band 1 to pass therethrough. In FIG. 3B, ZA1 indicates the impedance of the first filter 62 in the frequency band of Band 1 when the first filter 62 is seen from a point on the first wiring 111 (point on the line A1) connected to the common terminal 30 of the third switch 3 in FIG. 1. In FIG. 3B, ZA3 indicates the impedance of the first filter 62 in the frequency band of Band 1 when the first filter 62 is seen from a point on the third wiring 113 (point on the line A3) in FIG. 1. In FIG. 3B, ZA4 indicates the impedance of the first filter 62 in the frequency band of Band 1 when the first filter 62 is seen from a point on the side of the common terminal 40 of the first switch 4 (point on the line A4) in FIG. 1. In FIG. 3B, ZA5 indicates the impedance of the first filter 62 in the frequency band of Band 1 when the first filter 62 is seen from a point between the inductor 9 and the antenna terminal 2 (point on the line A5) in FIG. 1. That is, in FIG. 3B, ZA5 indicates the impedance of the first filter 62 when the first filter 62 is seen from the antenna terminal 2 in FIG. 1.

Figure 3C:
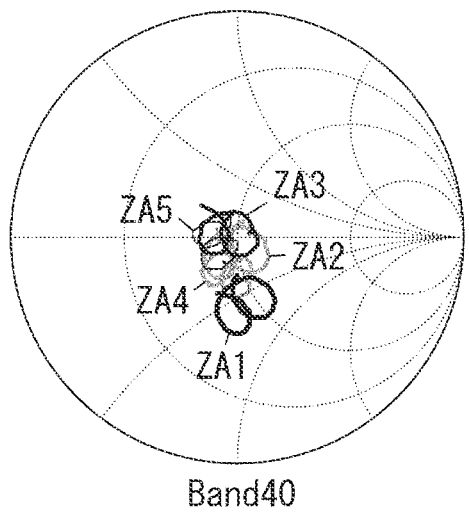
FIG. 3C is a Smith chart of a Band 40 filter in the radio-frequency circuit shown in FIG. 1.

FIG. 3C is a Smith chart illustrating the impedances of the second filter 71 that allows radio-frequency signals in Band 40 to pass therethrough. In FIG. 3C, ZA1 indicates the impedance of the second filter 71 in the frequency band of Band 40 when the second filter 71 is seen from a point on a second wiring 112 (point on the line A1) connected to the common terminal 50 of the second switch 5 in FIG. 1. In FIG. 3C, ZA2 indicates the impedance of the second filter 71 in the frequency band of Band 40 when the second filter 71 is seen from a point on the first wiring 112 (point on the line A2) between the inductor 8 and the node T1 in FIG. 1. In FIG. 3C, ZA3 indicates the impedance of the second filter 71 in the frequency band of Band 40 when the second filter 71 is seen from a point on the third wiring 113 (point on the line A3) in FIG. 1. In FIG. 3C, ZA4 indicates the impedance of the second filter 71 in the frequency band of Band 40 when the second filter 71 is seen from a point on the side of the common terminal 40 of the first switch 4 (point on the line A4) in FIG. 1. In FIG. 3C, ZA5 indicates the impedance of the second filter 71 in the frequency band of Band 40 when the second filter 71 is seen from a point between the inductor 9 and the antenna terminal 2 (point on the line A5) in FIG. 1. That is, in FIG. 3C, ZA5 indicates the impedance of the second filter 71 when the second filter 71 is seen from the antenna terminal 2 in FIG. 1. In FIG. 3C, the reason why ZA2 is positioned farther toward the inductive side than ZA1 is due to the effect of the inductor 8.

Figure 3D:
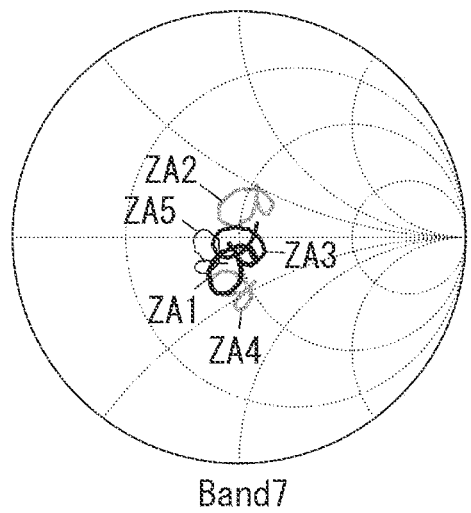
FIG. 3D is a Smith chart of a Band 7 filter in the radio-frequency circuit shown in FIG. 1.

FIG. 3D is a Smith chart illustrating the impedances of the second filter 72 that allows radio-frequency signals in Band 7 to pass therethrough. In FIG. 3D, ZA1 indicates the impedance of the second filter 72 in the frequency band of Band 7 when the second filter 72 is seen from a point on the second wiring 112 (point on the line A1) connected to the common terminal 50 of the second switch 5 in FIG. 1. In FIG. 3D, ZA2 indicates the impedance of the second filter 72 in the frequency band of Band 7 when the second filter 72 is seen from a point on the first wiring 112 (point on the line A2) between the inductor 8 and the node T1 in FIG. 1. In FIG. 3D, ZA3 indicates the impedance of the second filter 72 in the frequency band of Band 7 when the second filter 72 is seen from a point on the third wiring 113 (point on the line A3) in FIG. 1. In FIG. 3D, ZA4 indicates the impedance of the second filter 72 in the frequency band of Band 7 when the second filter 72 is seen from a point on the side of the common terminal 40 of the first switch 4 (point on the line A4) in FIG. 1. In FIG. 3D, ZA5 indicates the impedance of the second filter 72 in the frequency band of Band 7 when the second filter 72 is seen from a point between the inductor 9 and the antenna terminal 2 (point on the line A5) in FIG. 1. That is, in FIG. 3D, ZA5 indicates the impedance of the second filter 72 when the second filter 72 is seen from the antenna terminal 2 in FIG. 1. In FIG. 3D, the reason why ZA2 is positioned farther toward the inductive side than ZA1 is due to the effect of the inductor 8.

The Smith charts of FIGS. 5A through 5D show that, in the radio-frequency circuit $1q$ according to the first comparative example, the impedance of each of the plural filters seen from the antenna terminal 2 deviates from 50Ω. The Smith charts of FIGS. 5A through 5D also show that, in the radio-frequency circuit $1q$, the impedance of the second filter 71 using Band 40 and that of the second filter 72 using Band 7 seen from the antenna terminal 2 deviate from 50Ω toward the lower impedance side. In the radio-frequency circuit $1q$, the impedance of the first filter 61 that allows radio-frequency signals in Band 3, which is the lowest frequency band, to pass therethrough is about 60Ω, while the impedance of the second filter 72 that allows radio-frequency signals in Band 7, which is the highest frequency band, to pass therethrough is about 30Ω.

In contrast, the Smith charts of FIGS. 3A through 3D show that, in the radio-frequency circuit 1 according to the first embodiment, the impedance of the second filter 71 using Band 40 and that of the second filter 72 using Band 7 seen from the antenna terminal 2 are less likely to shift from 50Ω toward the lower impedance side and the capacitive side than in the radio-frequency circuit $1q$ according to the first comparative example.

(4) Radio-Frequency Front-End Circuit

Hereinafter, the radio-frequency front-end circuit 200 will be described below with reference to FIG. 2.

The radio-frequency front-end circuit 200 includes the radio-frequency circuit 1, a first low-noise amplifier 16, and a second low-noise amplifier 18. The first low-noise amplifier 16 is connected to the plural first filters 6 of the radio-frequency circuit 1. The second low-noise amplifier 18 is connected to the plural second filters 7 of the radio-frequency circuit 1. The radio-frequency front-end circuit 200 also includes two signal output terminals 21 and 22.

The first low-noise amplifier 16 has an input terminal and an output terminal. The input terminal of the first low-noise amplifier 61 is connected to the third switch 3. The output terminal of the first low-noise amplifier 16 is connected to the signal output terminal 21. The first low-noise amplifier 16 amplifies a radio-frequency signal input into the input terminal and outputs the amplified radio-frequency signal from the output terminal.

The second low-noise amplifier 18 has an input terminal and an output terminal. The input terminal of the second low-noise amplifier 18 is connected to the second switch 5. The output terminal of the second low-noise amplifier 18 is connected to the signal output terminal 22. The second low-noise amplifier 18 amplifies a radio-frequency signal input into the input terminal and outputs the amplified radio-frequency signal from the output terminal.

The signal output terminal 21 is a terminal via which a radio-frequency signal (received signal) from the first low-noise amplifier 16 is output to an external circuit (signal processing circuit 301, for example).

The signal output terminal 22 is a terminal via which a radio-frequency signal (received signal) from the second low-noise amplifier 18 is output to an external circuit (signal processing circuit 301, for example).

The radio-frequency front-end circuit 200 also includes a fourth switch 14, a fifth switch 15, a first input matching circuit 17, and a second input matching circuit 19.

The fourth switch 14 includes a common terminal 140 and plural selection terminals (a first selection terminal 141 and a second selection terminal 142). The fourth switch 14 changes the connection state between the common terminal 140 and each of the first selection terminal 141 and the second selection terminal 142. The fourth switch 14 is a switch that switches between a first state, a second state, a third state, and a fourth state. In the first state, the common terminal 140 and the first selection terminal 141 are connected to each other. In the second state, the common terminal 140 and the second selection terminal 142 are connected to each other. In the third state, the common terminal 140 is connected to both of the first selection terminal 141 and the second selection terminal 142. In the fourth state, the common terminal 140 is neither connected to the first selection terminal 141 nor the second selection terminal 142. That is, the first selection terminal 141 and the second selection terminal 142 are connectable to the common terminal 140 at the same time. The fourth switch 14 is a switch that can connect at least one or more of the plural selection terminals (first selection terminal 141 and second selection terminal 142) to the common terminal 140. The fourth switch 14 is a switch that implements one-to-one connection and one-to-many connection, for example. The fourth switch 14 is a switch IC. The fourth switch 14 is controlled by the signal processing circuit 301, for example. The fourth switch 14 changes the connection state between the common terminal 140 and each of the first selection terminal 141 and the second selection terminal 142 in accordance with a control signal from the RF signal processing circuit 302 of the signal processing circuit 301.

The common terminal 140 of the fourth switch 14 is connected to the input terminal of the first low-noise amplifier 16 via the first input matching circuit 17. The first selection terminal 141 of the fourth switch 14 is connected to the first filter 61 that allows radio-frequency signals in Band 3 to pass therethrough. The second selection terminal 142 of the fourth switch 14 is connected to the first filter 62 that allows radio-frequency signals in Band 1 to pass therethrough.

The fifth switch 15 includes a common terminal 150 and plural (two in this example) selection terminals (a first selection terminal 151 and a second selection terminal 152). The fifth switch 15 changes the connection state between the common terminal 150 and each of the first selection terminal 151 and the second selection terminal 152. The fifth switch 15 is a switch that switches between a first state, a second state, a third state, and a fourth state. In the first state, the common terminal 150 and the first selection terminal 151 are connected to each other. In the second state, the common terminal 150 and the second selection terminal 152 are connected to each other. In the third state, the common terminal 150 is connected to both of the first selection terminal 151 and the second selection terminal 152. In the fourth state, the common terminal 150 is neither connected to the first selection terminal 151 nor the second selection terminal 152. That is, the first selection terminal 151 and the second selection terminal 152 are connectable to the common terminal 150 at the same time. The fifth switch 15 is a switch that can connect at least one or more of the plural selection terminals (first selection terminal 151 and second selection terminal 152) to the common terminal 150. The fifth switch 15 is a switch that implements one-to-one connection and one-to-many connection, for example. The fifth switch 15 is a switch IC. The fifth switch 15 is controlled by the signal processing circuit 301 (see FIG. 2), for example. The fifth switch 15 changes the connection state between the common terminal 150 and each of the first selection terminal 151 and the second selection terminal 152 in accordance with a control signal from the RF signal processing circuit 302 of the signal processing circuit 301.

The common terminal 150 of the fifth switch 15 is connected to the input terminal of the second low-noise amplifier 18 via the second input matching circuit 19. The first selection terminal 151 of the fifth switch 15 is connected to the second filter 71 that allows radio-frequency signals in Band 40 to pass therethrough. The second selection terminal 152 of the fifth switch 15 is connected to the second filter 72 that allows radio-frequency signals in Band 7 to pass therethrough.

The first input matching circuit 17 is disposed on a signal path between the input terminal of the first low-noise amplifier 16 and the common terminal 140 of the fourth switch 14. The first input matching circuit 17 is a circuit for providing impedance matching between the first low-noise amplifier 16 and the plural first filters 61 and 62. The first input matching circuit 17 is constituted by one inductor, for example, but is not restricted thereto and may include plural inductors and plural capacitors, for example.

The second input matching circuit 19 is disposed on a signal path between the input terminal of the second low-noise amplifier 18 and the common terminal 150 of the fifth switch 15. The second input matching circuit 19 is a circuit for providing impedance matching between the second low-noise amplifier 18 and the plural second filters 71 and 72. The second input matching circuit 19 is constituted by one inductor, for example, but is not restricted thereto and may include plural inductors and plural capacitors, for example.

The radio-frequency front-end circuit 200 amplifies a radio-frequency signal (received signal) input into the antenna terminal 2 from the antenna 310 and outputs the amplified radio-frequency signal to the signal processing circuit 301. The signal processing circuit 301 is not an element forming the radio-frequency front-end circuit 200, but an element forming the communication apparatus 300 including the radio-frequency front-end circuit 200. The radio-frequency front-end circuit 200 according to the first embodiment is controlled by the signal processing circuit 301 of the communication apparatus 300, for example.

When simultaneous communication of Band 3, Band 1, Band 40, and Band 7, for example, is performed, in the radio-frequency front-end circuit 200, the first switch 4, the third switch 3, the second switch 5, the fourth switch 14, and the fifth switch 15 are in the following connection states.

In the first switch 4, the first selection terminal 41 is connected to the common terminal 40. In the third switch 3, the first selection terminal 31 and the second selection terminal 32 are connected to the common terminal 30 at the same time. In the second switch 5, the first selection terminal 51 and the second selection terminal 52 are connected to the common terminal 50 at the same time. In the fourth switch 14, the first selection terminal 141 and the second selection terminal 142 are connected to the common terminal 140 at the same time. In the fifth switch 15, the first selection terminal 151 and the second selection terminal 152 are connected to the common terminal 150 at the same time.

A radio-frequency module including the radio-frequency front-end circuit 200 is formed by, for example, mounting multiple circuit devices of the radio-frequency front-end circuit 200 other than the radio-frequency circuit 1 on the mounting substrate of a radio-frequency module including the radio-frequency circuit 1. The multiple circuit devices include the first low-noise amplifier 16, the second low-noise amplifier 18, the fourth switch 14, the fifth switch 15, the first input matching circuit 17, and the second input matching circuit 19.

(5) Communication Apparatus

Figure 2:
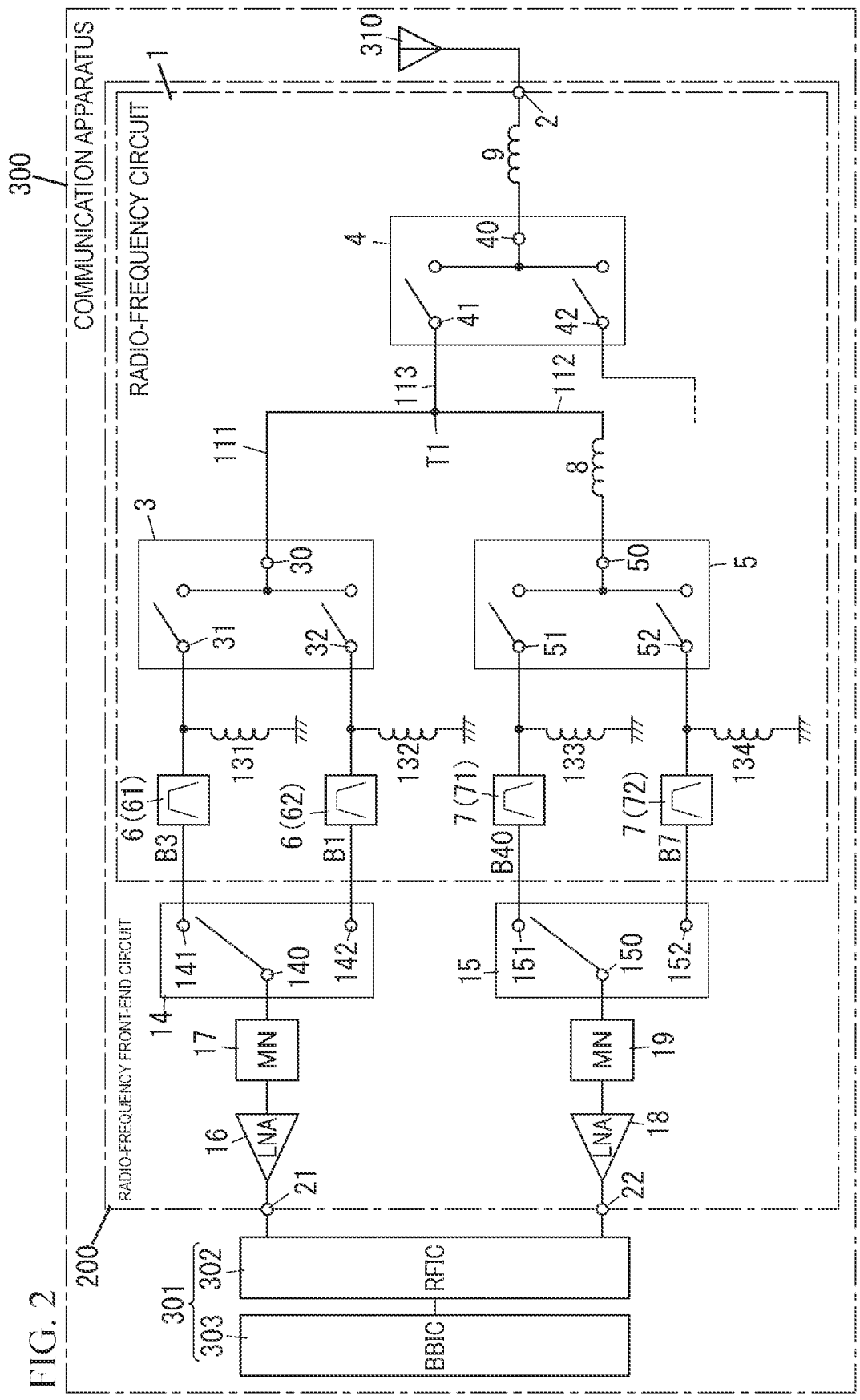
FIG. 2 is a circuit diagram of a radio-frequency front-end circuit and a communication apparatus including the radio-frequency circuit shown in FIG. 1.

As shown in FIG. 2, the communication apparatus 300 includes the radio-frequency front-end circuit 200 and the signal processing circuit 301. The communication apparatus 300 also includes the antenna 310.

The signal processing circuit 301 includes the RF signal processing circuit 302 and a baseband signal processing circuit 303, for example. The RF signal processing circuit 302 is a RFIC (Radio Frequency Integrated Circuit), for example, and performs signal processing on a radio-frequency signal. The RF signal processing circuit 302 performs signal processing, such as down-conversion, on a radio-frequency signal (received signal) output from the radio-frequency front-end circuit 200 and outputs the radio-frequency signal subjected to signal processing to the baseband signal processing circuit 303. The baseband signal processing circuit 303 is a BBIC (Baseband Integrated Circuit). The received signal processed by the baseband signal processing circuit 303 is used as an image signal for displaying an image or as an audio signal for communication. The radio-frequency front-end circuit 200 transfers a radio-frequency signal (received signal) between the antenna 310 and the RF signal processing circuit 302 of the signal processing circuit 301. In the communication apparatus 300, the provision of the baseband signal processing circuit 303 may be omitted.

(6) Conclusions (6.1) Radio-Frequency Circuit

A radio-frequency circuit 1 according to the first embodiment includes an antenna terminal 2, a first switch 4, a second switch 5, plural (two in this example) first filters 6 (first filters 61 and 62), and plural (two in this example) second filters 7 (second filters 71 and 72). The first switch 4 is connected to the antenna terminal 2. The second switch 5 is connected to the first switch 4 and is connected to the antenna terminal 2 via the first switch 4. The plural second filters 7 are connected to the antenna terminal 2 via the second switch 5 and the first switch 4. The radio-frequency circuit 1 further includes an inductor 8. The inductor 8 is not connected in series with the plural first filters 6 between the first switch 4 and the plural first filters 6. The inductor 8 is connected in series with the first switch 4 and the second switch 5 between the first switch 4 and the second switch 5.

In the radio-frequency circuit 1 according to the first embodiment, it is possible to reduce variations among impedances of the plural filters (first filters 61 and 62 and second filters 71 and 72) in the communication bands thereof when the plural filters are seen from the antenna terminal 2. The impedance in a communication band is the impedance of each of the plural filters in its band seen from the antenna terminal 2. In the radio-frequency circuit 1 according to the first embodiment, the impedance of each of the plural second filters 7 in the frequency bands of the second communication band is capacitive on a Smith chart when the second filters 7 are seen from the side of the second switch 5 opposite the side of the second filters 7 (which is a point on the line A1 and the substantially the same point as the common terminal 50 of the second switch 5).

By the mere addition of the inductor 8, the radio-frequency circuit 1 according to the first embodiment can obtain high characteristics in multiple operation modes (for example, communication using one of the plural filters and simultaneous communication, such as carrier aggregation, using two or more of the plural filters). As a result, the radio-frequency circuit 1 of the first embodiment can be reduced in size, compared with a circuit in which the impedance is adjusted for each of plural filters. In the radio-frequency circuit 1 according to the first embodiment, the inductance of the inductor 8 can be 1 nH or higher, as discussed above. If the inductance of the inductor 8 is too low, the effect of the provision of the inductor 8 is not sufficiently exhibited. If the inductance is too high, the characteristics are degraded.

(6.2) Radio-Frequency Front-End Circuit

A radio-frequency front-end circuit 200 according to the first embodiment includes the radio-frequency circuit 1, a first low-noise amplifier 16, and a second low-noise amplifier 18. The first low-noise amplifier 16 is connected to the plural first filters 6 of the radio-frequency circuit 1. The second low-noise amplifier 18 is connected to the plural second filters 7 of the radio-frequency circuit 1.

In the radio-frequency front-end circuit 200 according to the first embodiment, it is possible to reduce variations among impedances of the plural filters (first filters 61 and 62 and second filters 71 and 72) in the communication bands thereof when the plural filters are seen from the antenna terminal 2.

(6.3) Communication Apparatus

A communication apparatus 300 according to the first embodiment includes the radio-frequency front-end circuit 200 and a signal processing circuit 301. The signal processing circuit 301 performs signal processing on radio-frequency signals of the first communication band and those of the second communication band. The communication apparatus 300 according to the first embodiment further includes an antenna 310.

In the communication apparatus 300 according to the first embodiment, it is possible to reduce variations among impedances of the plural filters (first filters 61 and 62 and second filters 71 and 72) in the communication bands thereof when the plural filters are seen from the antenna terminal 2.

Second Embodiment

Figure 10:
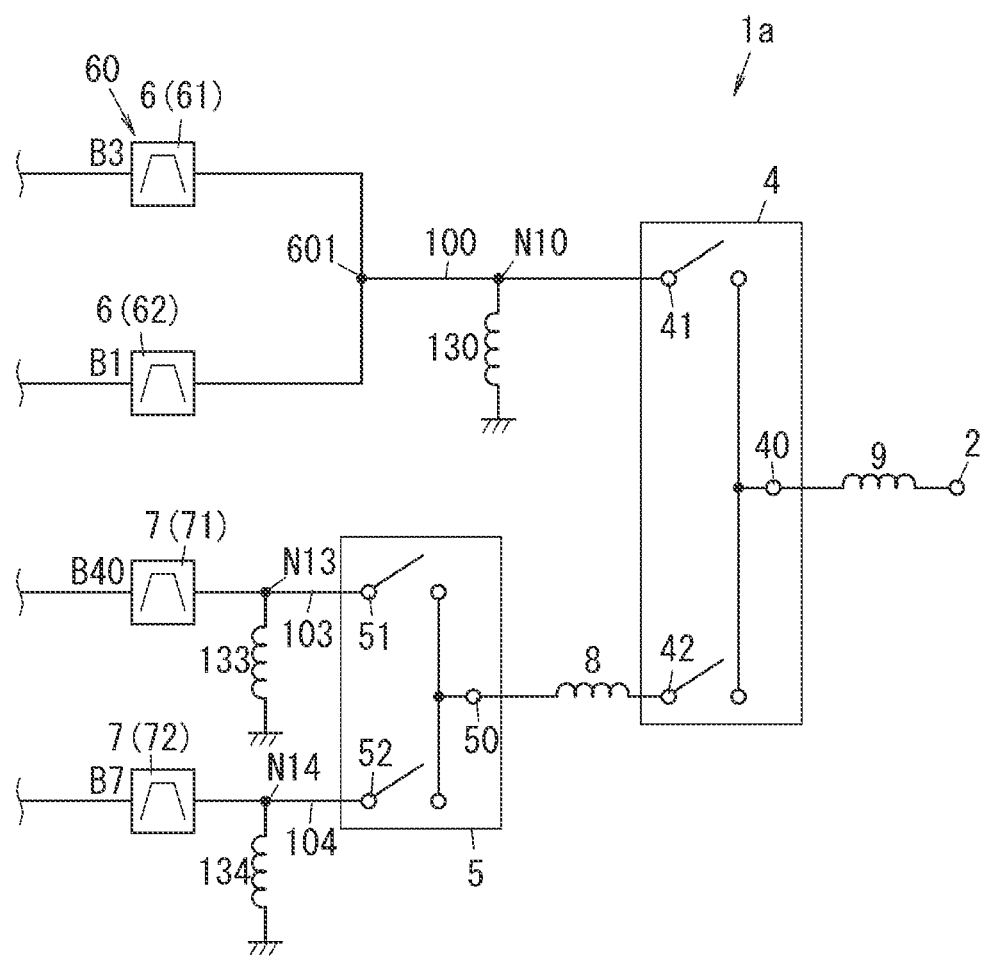
FIG. 10 is a circuit diagram of a radio-frequency circuit according to a second embodiment.
Figure 11:
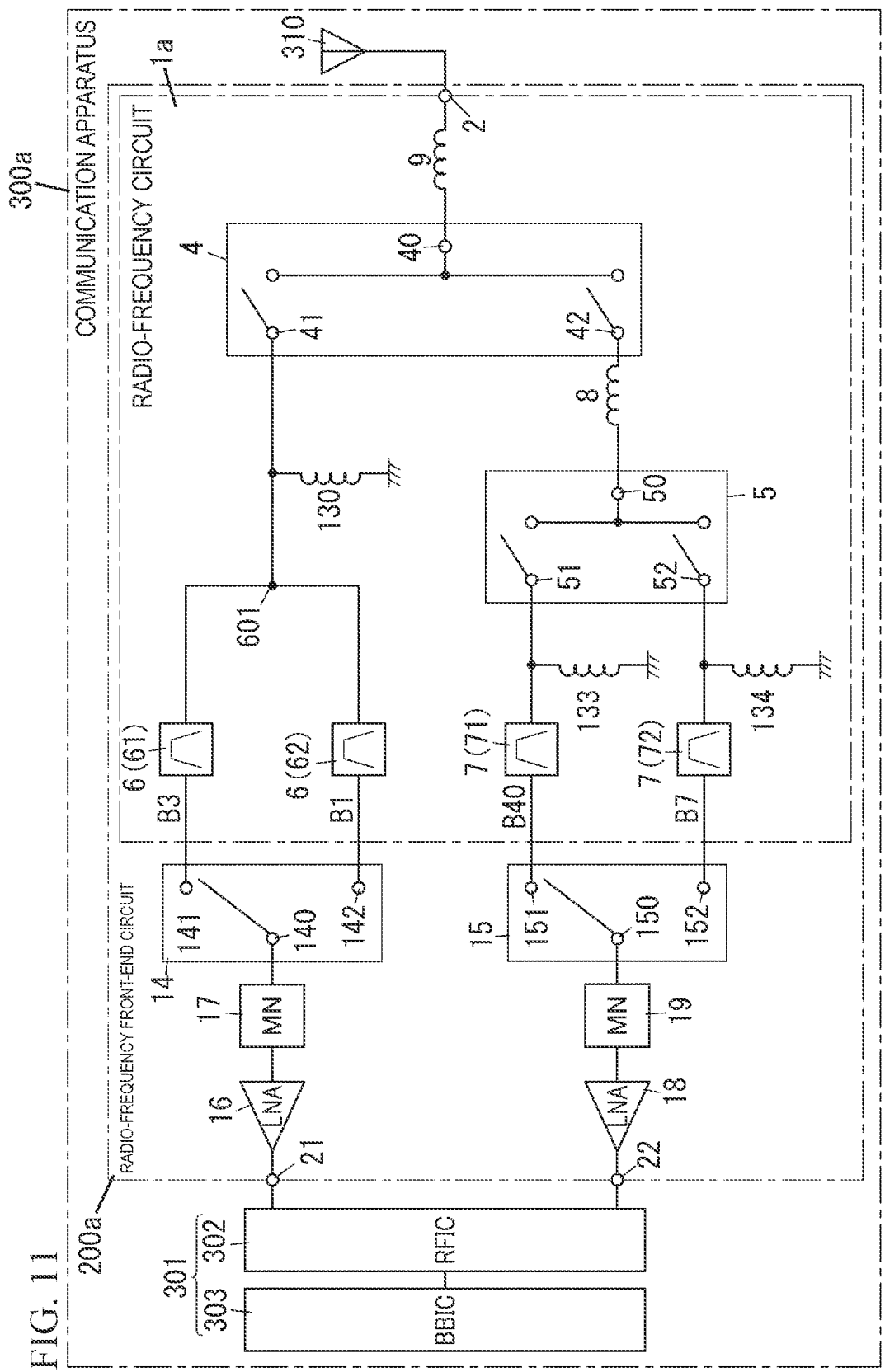
FIG. 11 is a circuit diagram of a radio-frequency front-end circuit and a communication apparatus including the radio-frequency circuit shown in FIG. 10.

Hereinafter, a radio-frequency circuit 1a, a radio-frequency front-end circuit 200a, and a communication apparatus 300a according to a second embodiment will be described below with reference to FIGS. 10 and 11. In the explanation of the radio-frequency circuit 1a, the radio-frequency front-end circuit 200a, and the communication apparatus 300a according to the second embodiment, elements similar to those of the radio-frequency circuit 1, the radio-frequency front-end circuit 200, and the communication apparatus 300 according to the first embodiment are designated by like reference numerals and an explanation thereof will be omitted.

The radio-frequency circuit 1 according to the first embodiment shown in FIG. 1 includes a first-communication-band circuit and a second-communication band circuit. The first-communication-band circuit includes the first filters 61 and 62, the third switch 3, and the two shunt inductors 131 and 132. The second-communication-band circuit includes the second filters 71 and 72, the second switch 5, the two shunt inductors 133 and 134, and the inductor 8.

The radio-frequency circuit 1a according to the second embodiment is different from the radio-frequency circuit 1 according to the first embodiment in that it includes a first-communication-band circuit including a multiplexer 60 linking the first filters 61 and 62 and a shunt inductor 130, instead of the first-communication-band circuit in the radio-frequency circuit 1 of the first embodiment. In the radio-frequency circuit 1a according to the second embodiment, the inductor 8 is connected in series with the second switch 5 and the first switch 4 between the common terminal 50 of the second switch 5 and the second selection terminal 42 of the first switch 4. The inductance of the inductor 8 is 1.5 nH, for example.

The multiplexer 60 has a node 601 which links the input terminals (terminals on the side of the antenna terminal) of the two first filters 61 and 62. In the radio-frequency circuit 1a according to the second embodiment, the node 601 of the multiplexer 60 is connected to the antenna terminal 2 via the first switch 4. The shunt inductor 130 is connected between a ground and a node N10 located on a wiring 100 which connects the node 601 and the first selection terminal 41 of the first switch 4.

The radio-frequency circuit 1a according to the second embodiment is for use in the radio-frequency front-end circuit 200a of the communication apparatus 300a (see FIG. 11), for example.

When simultaneous communication of Band 3, Band 1, Band 40, and Band 7, for example, is performed, in the radio-frequency circuit 1a, the first selection terminal 41 and the second selection terminal 42 are connected to the common terminal 40 at the same time in the first switch 4, and the first selection terminal 51 and the second selection terminal 52 are connected to the common terminal 50 at the same time in the second switch 5.

When simultaneous communication of Band 3, Band 1, and Band 40, for example, is preformed, in the radio-frequency circuit 1a, the first selection terminal 41 and the second selection terminal 42 are connected to the common terminal 40 at the same time in the first switch 4, and the first selection terminal 51 is connected to the common terminal 50 in the second switch 5.

When simultaneous communication of Band 3 and Band 1, for example, is performed, in the radio-frequency circuit 1a, the first selection terminal 41 is connected to the common terminal 40 in the first switch 4.

When simultaneous communication of Band 40 and Band 7, for example, is performed, in the radio-frequency circuit 1a, the second selection terminal 42 is connected to the common terminal 40 in the first switch 4, and the first selection terminal 51 and the second selection terminal 52 are connected to the common terminal 50 at the same time in the second switch 5.

When Band 40 communication, for example, is performed, in the radio-frequency circuit 1a, the second selection terminal 42 is connected to the common terminal 40 in the first switch 4, and the first selection terminal 51 is connected to the common terminal 50 in the second switch 5.

When Band 7 communication, for example, is performed, in the radio-frequency circuit 1a, the second selection terminal 42 is connected to the common terminal 40 in the first switch 4, and the second selection terminal 52 is connected to the common terminal 50 in the second switch 5.

FIGS. 12A through 12D are Smith charts illustrating the impedances of the individual filters (first filters 61 and 62 and second filters 71 and 72) in the radio-frequency circuit 1a according to the second embodiment. FIGS. 13A through 13D are Smith charts illustrating the impedances of individual filters in a radio-frequency circuit according to a second comparative example. The radio-frequency circuit according to the second comparative example is substantially the same as the radio-frequency circuit 1a according to the second embodiment, except that it does not include the inductor 8. A detailed explanation and illustration of the radio-frequency circuit according to the second comparative example will thus be omitted.

Figure 12A:
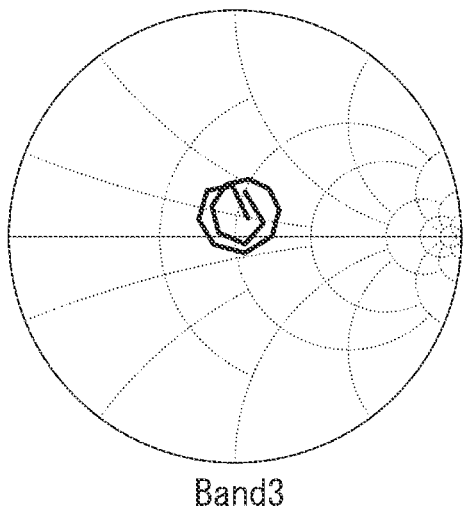
FIG. 12A is a Smith chart of a Band 3 filter in the radio-frequency circuit shown in FIG. 10.

FIG. 12A is a Smith chart illustrating the impedance of the first filter 61 that allows radio-frequency signals in Band 3 to pass therethrough. FIG. 12A illustrates the impedance of the first filter 61 in the frequency band of Band 3 (that is, the band of the first filter 61) when the first filter 61 is seen from the antenna terminal 2 in FIG. 10.

Figure 12B:
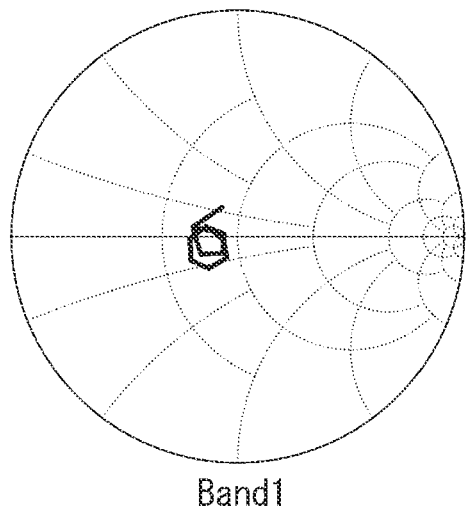
FIG. 12B is a Smith chart of a Band 1 filter in the radio-frequency circuit shown in FIG. 10.

FIG. 12B is a Smith chart illustrating the impedance of the first filter 62 that allows radio-frequency signals in Band 1 to pass therethrough. FIG. 12B illustrates the impedance of the first filter 62 in the frequency band of Band 1 when the first filter 62 is seen from the antenna terminal 2 in FIG. 10.

Figure 12C:
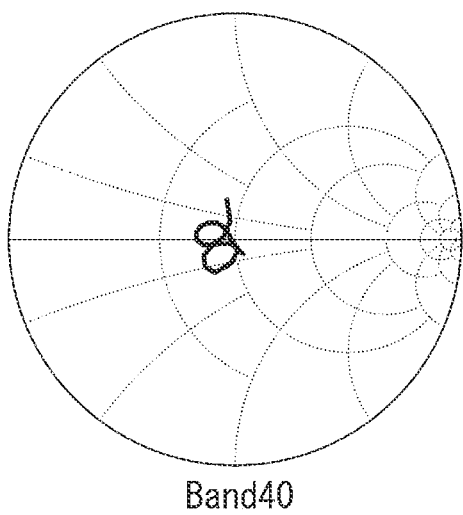
FIG. 12C is a Smith chart of a Band 40 filter in the radio-frequency circuit shown in FIG. 10.

FIG. 12C is a Smith chart illustrating the impedance of the second filter 71 that allows radio-frequency signals in Band 40 to pass therethrough. FIG. 12C illustrates the impedance of the second filter 71 in the frequency band of Band 40 when the second filter 71 is seen from the antenna terminal 2 in FIG. 10.

Figure 12D:
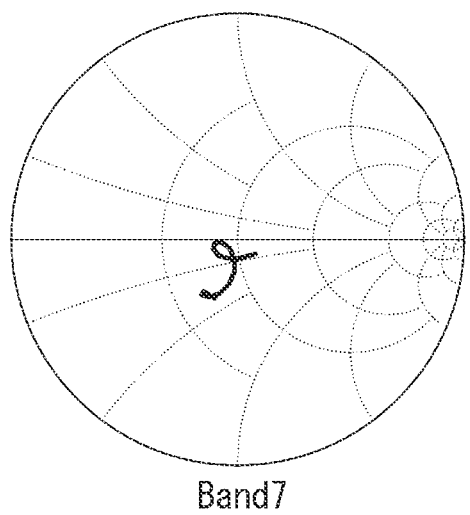
FIG. 12D is a Smith chart of a Band 7 filter in the radio-frequency circuit shown in FIG. 10.

FIG. 12D is a Smith chart illustrating the impedance of the second filter 72 that allows radio-frequency signals in Band 7 to pass therethrough. FIG. 12D illustrates the impedance of the second filter 72 in the frequency band of Band 7 when the second filter 72 is seen from the antenna terminal 2 in FIG. 10.

Figure 13A:
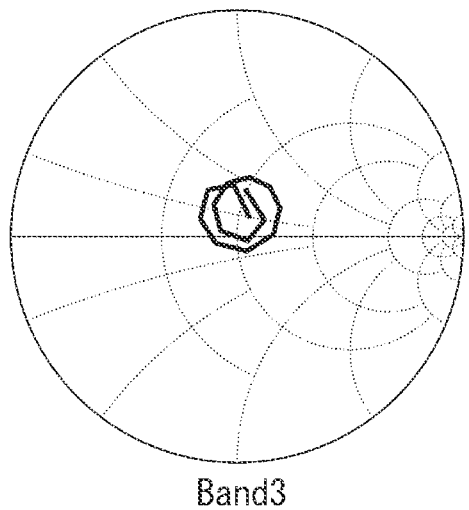
FIG. 13A is a Smith chart of a Band 3 filter in a radio-frequency circuit according to a second comparative example.

FIG. 13A is a Smith chart illustrating the impedance of the first filter 61 that allows radio-frequency signals in Band 3 to pass therethrough. FIG. 13A illustrates the impedance of the first filter 61 in the frequency band of Band 3 (that is, the band of the first filter 61) when the first filter 61 is seen from the antenna terminal 2.

Figure 13B:
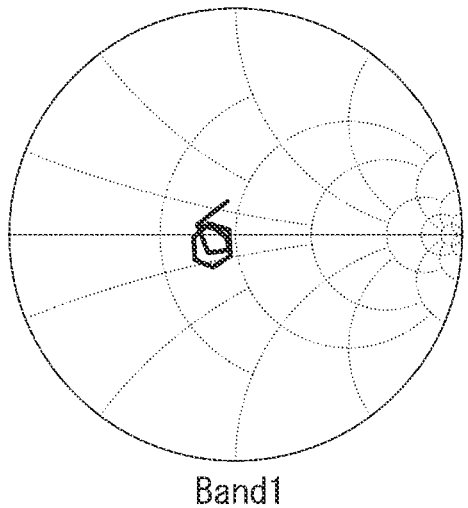
FIG. 13B is a Smith chart of a Band 1 filter in the radio-frequency circuit according to the second comparative example.

FIG. 13B is a Smith chart illustrating the impedance of the first filter 62 that allows radio-frequency signals in Band 1 to pass therethrough. FIG. 13B illustrates the impedance of the first filter 62 in the frequency band of Band 1 when the first filter 62 is seen from the antenna terminal 2.

Figure 13C:
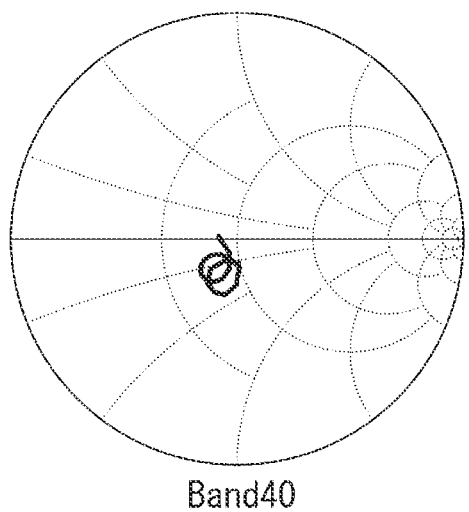
FIG. 13C is a Smith chart of a Band 40 filter in the radio-frequency circuit according to the second comparative example.

FIG. 13C is a Smith chart illustrating the impedance of the second filter 71 that allows radio-frequency signals in Band 40 to pass therethrough. FIG. 13C illustrates the impedance of the second filter 71 in the frequency band of Band 40 when the second filter 71 is seen from the antenna terminal 2.

Figure 13D:
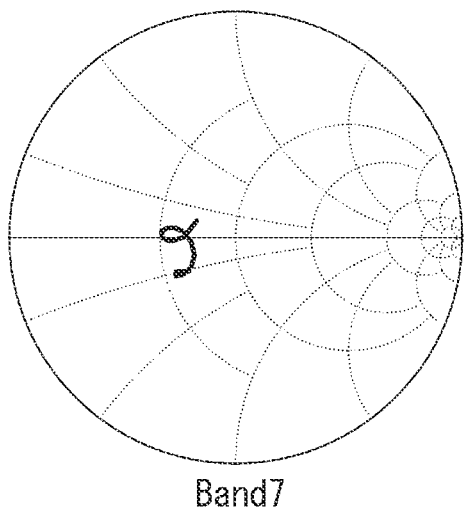
FIG. 13D is a Smith chart of a Band 7 filter in the radio-frequency circuit according to the second comparative example.

FIG. 13D is a Smith chart illustrating the impedance of the second filter 72 that allows radio-frequency signals in Band 7 to pass therethrough. FIG. 13D illustrates the impedance of the second filter 72 in the frequency band of Band 7 when the second filter 72 is seen from the antenna terminal 2.

FIGS. 12C and 13C show that, in the radio-frequency circuit 1a according to the second embodiment, the impedance of the second filter 71 in the frequency band of Band 40 when the second filter 71 is seen from the antenna terminal 2 can shift to the higher impedance side and approach 50Ω, compared with the radio-frequency circuit according to the second comparative example.

FIGS. 12D and 13D show that, in the radio-frequency circuit 1a according to the second embodiment, the impedance of the second filter 72 in the frequency band of Band 7 when the second filter 72 is seen from the antenna terminal 2 can shift to the higher impedance side and approach 50Ω, compared with the radio-frequency circuit according to the second comparative example.

Because of the provision of the inductor 8, as in the radio-frequency circuit 1 according to the first embodiment, the radio-frequency circuit 1a according to the above-described second embodiment can reduce variations among impedances of plural filters (first filters 61 and 62 and second filters 71 and 72) in the communication bands thereof when the filters are seen from the antenna terminal 2.

The radio-frequency front-end circuit 200a according to the second embodiment includes the radio-frequency circuit 1a. As in the radio-frequency front-end circuit 200 according to the first embodiment, the radio-frequency front-end circuit 200a according to the second embodiment can reduce variations among impedances of plural filters (first filters 61 and 62 and second filters 71 and 72) in the communication bands thereof when the filters are seen from the antenna terminal 2.

The communication apparatus 300a according to the second embodiment includes the radio-frequency front-end circuit 200a and the signal processing circuit 301. As in the communication apparatus 300 according to the first embodiment, the communication apparatus 300a according to the second embodiment can reduce variations among impedances of plural filters (first filters 61 and 62 and second filters 71 and 72) in the communication bands thereof when the filters are seen from the antenna terminal 2.

The above-described embodiments are only examples of various embodiments of the disclosure. Various changes may be made to the above-described embodiments in accordance with certain factors, such as the design.

The number of selection terminals of each of the first switch 4, the second switch 5, the third switch 3, the fourth switch 14, and the fifth switch 15 is not limited to the above-described number as long as plural selection terminals are provided. In the radio-frequency circuit 1, the first switch 4 may only have the common terminal 40 (first terminal) and the first selection terminal 41 (second terminal) and thus may be a SPST (Single Pole Single Throw) switch. The radio-frequency circuits 1 and 1a may each include a circuit device between the antenna terminal 2 and the first switch 4 in addition to the inductor 9. The provision of the inductor 9 between the antenna terminal 2 and the first switch 4 in each of the radio-frequency circuits 1 and 1a may be omitted.

It is possible that the radio-frequency circuits 1 and 1a are not necessarily controlled by a control signal from the RF signal processing circuit 302 of the signal processing circuit 301. For example, the radio-frequency circuits 1 and 1a may each include a control circuit that controls the first switch 4, the second switch 5, and the third switch 3.

When simultaneous communication of four or more communication bands is performed, in the radio-frequency circuits 1 and 1a, the multiple first communication bands include at least two bands selected from a group consisting of Band 1, Band 3, Band 25, Band 32, Band 34, Band 39, and Band 66, for example, while the multiple second communication bands include at least two bands selected from a group consisting of Band 30, Band 40, Band 7, and Band 41, for example.

When simultaneous communication of four or more communication bands is performed, in the radio-frequency circuits 1 and 1a, the multiple first communication bands include at least two bands selected from a group consisting of Band 1, Band 3, and Band 32, for example, while the multiple second communication bands include at least two bands selected from a group consisting of Band 40, Band 7, and Band 41, for example.

When simultaneous communication of four or more communication bands is performed, in the radio-frequency circuits 1 and 1a, the multiple first communication bands include Band 25 and Band 66, for example, while the multiple second communication bands include at least two bands selected from a group consisting of Band 30, Band 7, and Band 41, for example.

The number of each of the first filters 6 and the second filters 7 is not limited to two and may be one or three or more. If the number of first filters 6 is one and that of second filters 7 is one, in the radio-frequency circuit 1, for example, only one of the first filters 61 and 62 may be connected to the third switch 3, while only one of the second filters 71 and 72 may be connected to the second switch 5. In this case, each of the third switch 3 and the second switch 5 may be a SPST switch. Additionally, if the number of first filters 6 is one and that of second filters 7 is one, in the radio-frequency circuit 1a, instead of using the multiplexer 60, only one of the first filters 61 and 62 may be connected to the first selection terminal 41 of the first switch 4, while only one of the second filters 71 and 72 may be connected to the first selection terminal 51 of the second switch 5. In this case, the second switch 5 may be a SPST switch.

The acoustic wave filters are not limited to acoustic wave filters using surface acoustic waves and may be acoustic wave filters using boundary acoustic waves or Lamb waves, for example.

Each of the plural series arm resonators and plural parallel arm resonators forming the acoustic wave filter is not restricted to a SAW resonator, and may be a BAW (Bulk Acoustic Wave) resonator, for example.

The acoustic wave filter is not limited to a ladder filter and may be a longitudinally coupled resonator surface acoustic wave filter, for example.

The radio-frequency front-end circuit 200 may include a receive circuit connected to the second selection terminal 42 of the first switch 4. This receive circuit is a circuit that receives radio-frequency signals of a communication band which is lower than Band 3, for example.

The radio-frequency front-end circuit 200 may include a transmit circuit connected to the second selection terminal 42 of the first switch 4. The transmit circuit amplifies a transmit signal input from the signal processing circuit 301 and outputs the amplified signal to the antenna 310 via the antenna terminal 2. The transmit circuit includes a signal input terminal, a power amplifier, and an output matching circuit, for example. The signal input terminal is connected to the signal processing circuit 301. The power amplifier has an input terminal and an output terminal. The input terminal of the power amplifier is connected to the signal input terminal. The output terminal of the power amplifier is connected to the second selection switch 42 of the first switch 4 via the output matching circuit. The power amplifier amplifies a radio-frequency signal (transmit signal) input into the input terminal and outputs the amplified radio-frequency signal from the output terminal. If the radio-frequency front-end circuit 200 includes a transmit circuit, the RF signal processing circuit 302 of the communication apparatus 300 performs signal processing, such as up-conversion, for example, on a radio-frequency signal (transmit signal) output from the baseband signal processing circuit 303 and outputs the transmit signal subjected to signal processing. The baseband signal processing circuit 303 generates an I-phase signal and a Q-phase signal from a baseband signal. The baseband signal is an audio signal or an image signal, for example, input from an external source. The baseband signal processing circuit 303 performs IQ modulation processing by combining the generated I-phase and Q-phase signals and outputs the resulting transmit signal. The transmit signal is generated as a modulated signal (IQ signal) obtained as a result of a carrier signal of a predetermined frequency being subjected to amplitude modulation with a period longer than that of the carrier signal.

Aspects

The specification discloses the following aspects.

Radio-frequency circuits (1; 1a) according to a first aspect each includes an antenna terminal (2), a first switch (4), a second switch (5), a first filter (6), and a second filter (7). The first switch (4) is connected to the antenna terminal (2). The second switch (5) is connected to the first switch (4) and is connected to the antenna terminal (2) via the first switch (4). The first filter (6) is an acoustic wave filter that is connected to the first switch (4) without necessarily having the second switch (5) interposed therebetween and that allows a radio-frequency signal of a first communication band to pass through the first filter (6). The second filter (7) is an acoustic wave filter that is connected to the first switch (4) via the second switch (5) and that allows a radio-frequency signal of a second communication band to pass through the second filter (7). The second communication band is higher than the first communication band. Each of the radio-frequency circuits (1; 1a) further includes an inductor (8). The inductor (8) is not connected in series with the first filter (6) and is connected in series with the first switch (4) and the second switch (5) between the first switch (4) and the second switch (5).

The radio-frequency circuits (1; 1a) according to the first aspect can reduce variations among impedances of the plural filters (first filter 6 and second filter 7) in the communication bands thereof when the filters are seen from the antenna terminal (2).

In the radio-frequency circuit (1) according to a second aspect, in the first aspect, the first switch (4) includes a first terminal (common terminal 40) and a second terminal (first selection terminal 41). The first terminal (common terminal 40) is connected to the antenna terminal (2). The second terminal (first selection terminal 41) is connectable to the first terminal (common terminal 40). A node (T1) between a first wiring (111) and a second wiring (112) is connected to the second terminal (first selection terminal 41) via a third wiring (113). The first wiring (111) is connected to the first filter (6). The second wiring (112) is connected to the second switch (5) via the inductor (8).

In the radio-frequency circuit (1a) according to a third aspect, in the first aspect, the first switch (4) includes a common terminal (40), a first selection terminal (41), and a second selection terminal (42). The common terminal (40) is connected to the antenna terminal (2). The first selection terminal (41) is connected to the first filter (6). The second selection terminal (42) is connected to the second switch (5) via the inductor (8). In the first switch (4), the first selection terminal (41) and the second selection terminal (42) are connectable to the common terminal (40) at the same time.

In one of the first through third aspects, in each of the radio-frequency circuits (1; 1a) according to a fourth aspect, the first filter (6) is connected to the first switch (4) without necessarily having an inductance element interposed therebetween.

In each of the radio-frequency circuits (1; 1a) according to the fourth aspect, the insertion loss of the first filter (6) can be reduced.

In one of the first through fourth aspects, the radio-frequency circuits (1; 1a) according to a fifth aspect each includes plural first filters (6) and plural second filters (7). The first communication bands used in the respective first filters (6) are different from each other. The second communication bands used in the respective second filters (7) are different from each other. The multiple first communication bands include at least two bands selected from a group consisting of Band 1, Band 3, Band 25, Band 32, Band 34, Band 39, and Band 66. The multiple second communication bands include at least two of Band 30, Band 40, Band 7, and Band 41.

In one of the first through fourth aspects, the radio-frequency circuits (1; 1a) according to a sixth aspect each includes plural first filters (6) and plural second filters (7). The first communication bands used in the respective first filters (6) are different from each other. The second communication bands used in the respective second filters (7) are different from each other. The multiple first communication bands include at least two bands selected from a group consisting of Band 1, Band 3, and Band 32. The multiple second communication bands include at least two of Band 40, Band 7, and Band 41.

In one of the first through fourth aspects, the radio-frequency circuits (1; 1a) according to a seventh aspect each includes plural first filters (6) and plural second filters (7). The first communication bands used in the respective first filters (6) are different from each other. The second communication bands used in the respective second filters (7) are different from each other. The multiple first communication bands include Band 25 and Band 66. The multiple second communication bands include at least two of Band 30, Band 7, and Band 41.

Radio-frequency front-end circuits (200; 200a) according to an eighth aspect each includes one of the radio-frequency circuits (1; 1a) according to one of the first through seventh aspects, a first low-noise amplifier (16), and a second low-noise amplifier (18). The first low-noise amplifier (16) is connected to the first filter (6) of one of the radio-frequency circuits (1; 1a). The second low-noise amplifier (18) is connected to the second filter (7) of one of the radio-frequency circuits (1; 1a).

The radio-frequency front-end circuits (200; 200a) according to the eighth aspect can reduce variations among impedances of the plural filters (first filter 6 and second filter 7) in the communication bands thereof when the filters are seen from the antenna terminal (2).

Communication apparatuses (300; 300a) according to a ninth aspect each includes one of the radio-frequency front-end circuits (200; 200a) according to the eighth aspect and a signal processing circuit (301). The signal processing circuit (301) performs signal processing on a radio-frequency signal of the first communication band and a radio-frequency signal of the second communication band. The communication apparatuses (300; 300a) according to the ninth aspect can reduce variations among impedances of the plural filters (first filter 6 and second filter 7) in the communication bands thereof when the filters are seen from the antenna terminal (2).

REFERENCE SIGNS LIST 1, 1a, 1q, 1r, 1s radio-frequency circuit
2 antenna terminal
3 third switch
30 common terminal
31 first selection terminal
32 second selection terminal
4 first switch
40 common terminal (first terminal)
41 first selection terminal (second terminal)
42 second selection terminal
5 second switch
50 common terminal
51 first selection terminal
52 second selection terminal
6 first filter
61 first filter
62 first filter
7 second filter
71 second filter
72 second filter
8 inductor
9 inductor
16 first low-noise amplifier
17 first input matching circuit
18 second low-noise amplifier 19 second input matching circuit
21, 22 signal output terminal
60 multiplexer
601 node
100, 101, 102, 103, 104 wiring
111 first wiring
112 second wiring
113 third wiring
130, 131, 132, 133, 134 shunt inductor
200, 200a radio-frequency front-end circuit
300, 300a communication apparatus
301 signal processing circuit
302 RF signal processing circuit
303 baseband signal processing circuit
310 antenna
400 switch
401 switch
410 common terminal
411, 412, 413 selection terminal
800, 803, 804 shunt inductor
900, 901, 903, 904, 905 wiring
A1, A2, A3, A4, A11, A12, A13, A31, A32, A33 line
N10, N11, N12, N13, N14, N20, N22, N23, N24 node
T1 node

The invention claimed is:

1. A radio-frequency circuit comprising:
an antenna terminal;
a first switch connected to the antenna terminal;
a second switch connected to the first switch and connected to the antenna terminal via the first switch;
a first filter, which is an acoustic wave filter that is connected to the first switch without having the second switch interposed therebetween and that is configured to pass a radio-frequency signal of a first communication band;
a second filter, which is an acoustic wave filter that is connected to the first switch via the second switch and that is configured to pass a radio-frequency signal of a second communication band, the second communication band being higher in frequency than the first communication band; and
an inductor that is not connected in series with the first filter, but that is connected in series with the first switch and the second switch between the first switch and the second switch.

2. The radio-frequency circuit according to claim 1, wherein the first switch comprises:
a first terminal connected to the antenna terminal, and
a second terminal that is configured to be selectively connected to the first terminal; and
wherein a node between a first wiring and a second wiring is connected to the second terminal via a third wiring, the first wiring being connected to the first filter, the second wiring being connected to the second switch via the inductor.

3. The radio-frequency circuit according to claim 1, wherein the first switch comprises:
a common terminal connected to the antenna terminal,
a first selection terminal connected to the first filter, and
a second selection terminal connected to the second switch via the inductor; and
wherein the first selection terminal and the second selection terminal are configured to be selectively connected to the common terminal at the same time.

4. The radio-frequency circuit according to claim 1, wherein the first filter is connected to the first switch without having an inductance element interposed therebetween.

5. The radio-frequency circuit according to claim 1, comprising:
a plurality of the first filters; and
a plurality of the second filters, wherein:
the respective first communication bands of the radio-frequency signals passed by the plurality of the first filters are different from each other; and
the respective second communication bands of the radio-frequency signals passed by the plurality of the second filters are different from each other.

6. The radio-frequency circuit according to claim 5, wherein:
the plurality of the first communication bands include at least two of Band 1, Band 3, Band 25, Band 32, Band 34, Band 39, and Band 66; and
the plurality of the second communication bands include at least two of Band 30, Band 40, Band 7, and Band 41.

7. The radio-frequency circuit according to claim 5, wherein:
the plurality of the first communication bands include at least two of Band 1, Band 3, and Band 32; and
the plurality of the second communication bands include at least two of Band 40, Band 7, and Band 41.

8. The radio-frequency circuit according to claim 5, wherein:
the plurality of the first communication bands include Band 25 and Band 66; and
the plurality of the second communication bands include at least two of Band 30, Band 7, and Band 41.

9. A radio-frequency front-end circuit comprising:
the radio-frequency circuit according to claim 1;
a first low-noise amplifier connected to the first filter of the radio-frequency circuit; and
a second low-noise amplifier connected to the second filter of the radio-frequency circuit.

10. A communication apparatus comprising:
the radio-frequency front-end circuit according to claim 9; and
a signal processing circuit configured to process the radio-frequency signal of the first communication band and the radio-frequency signal of the second communication band.

* * * * *